US012648191B2

(12) United States Patent
Lin et al.

(10) Patent No.: US 12,648,191 B2
(45) Date of Patent: Jun. 2, 2026

(54) TRANSISTOR GATE ISOLATION STRUCTURES AND METHODS OF FORMING THE SAME

(71) Applicant: Taiwan Semiconductor Manufacturing Co., Ltd., Hsinchu (TW)

(72) Inventors: Li-Fong Lin, Hsinchu (TW); Wen-Kai Lin, Yilan County (TW); Zhen-Cheng Wu, Hsinchu (TW); Chi On Chui, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 754 days.

(21) Appl. No.: 17/818,057

(22) Filed: Aug. 8, 2022

(65) Prior Publication Data

US 2023/0378256 A1     Nov. 23, 2023

Related U.S. Application Data

(60) Provisional application No. 63/364,822, filed on May 17, 2022.

(51) Int. Cl.
| | |
|---|---|
| *H10D 62/10* | (2025.01) |
| *H10D 30/62* | (2025.01) |
| *H10D 64/01* | (2025.01) |
| *H10D 84/01* | (2025.01) |
| *H10D 84/03* | (2025.01) |

(52) U.S. Cl.
CPC ....... *H10D 62/116* (2025.01); *H10D 30/6211* (2025.01); *H10D 30/6219* (2025.01); *H10D*

*64/017* (2025.01); *H10D 84/0151* (2025.01); *H10D 84/038* (2025.01)

(58) Field of Classification Search
CPC . H10D 62/116; H10D 84/853; H10D 84/0158
See application file for complete search history.

(56) References Cited

U.S. PATENT DOCUMENTS

| | | |
|---|---|---|
| 10,586,860 B2 | 3/2020 | Shu et al. |
| 11,251,284 B2 | 2/2022 | Lin et al. |
| 2017/0345820 A1 | 11/2017 | Lin et al. |

(Continued)

FOREIGN PATENT DOCUMENTS

| | | |
|---|---|---|
| TW | 202002060 A | 1/2020 |
| TW | 202123324 A | 6/2021 |

*Primary Examiner* — William B Partridge
*Assistant Examiner* — Mehek Ahmed
(74) *Attorney, Agent, or Firm* — Slater Matsil, LLP

(57) ABSTRACT

Transistor gate isolation structures and methods of forming the same are provided. In an embodiment, a device includes: an isolation region; a first gate structure on the isolation region; a second gate structure on the isolation region; and a gate isolation structure between the first gate structure and the second gate structure in a first cross-section, an upper portion of the gate isolation structure having a first concentration of an element, a lower portion of the gate isolation structure having a second concentration of the element, the first concentration different from the second concentration, the lower portion extending continuously along a sidewall of the first gate structure, beneath the upper portion, and along a sidewall of the second gate structure.

20 Claims, 46 Drawing Sheets

(56)          References Cited

U.S. PATENT DOCUMENTS

| | | |
|---|---|---|
| 2019/0341294 A1 | 11/2019 | Huang et al. |
| 2020/0035549 A1* | 1/2020 | Wu ................... H01L 21/76832 |
| 2021/0118875 A1 | 4/2021 | Wu et al. |
| 2021/0134796 A1 | 5/2021 | Kim et al. |
| 2021/0193531 A1 | 6/2021 | Chiang et al. |
| 2021/0328043 A1 | 10/2021 | Lin et al. |
| 2022/0059653 A1 | 2/2022 | Chen et al. |

* cited by examiner

TRANSISTOR GATE ISOLATION STRUCTURES AND METHODS OF FORMING THE SAME

PRIORITY CLAIM AND CROSS-REFERENCE

This application claims the benefit of U.S. Provisional Application No. 63/364,822, filed on May 17, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
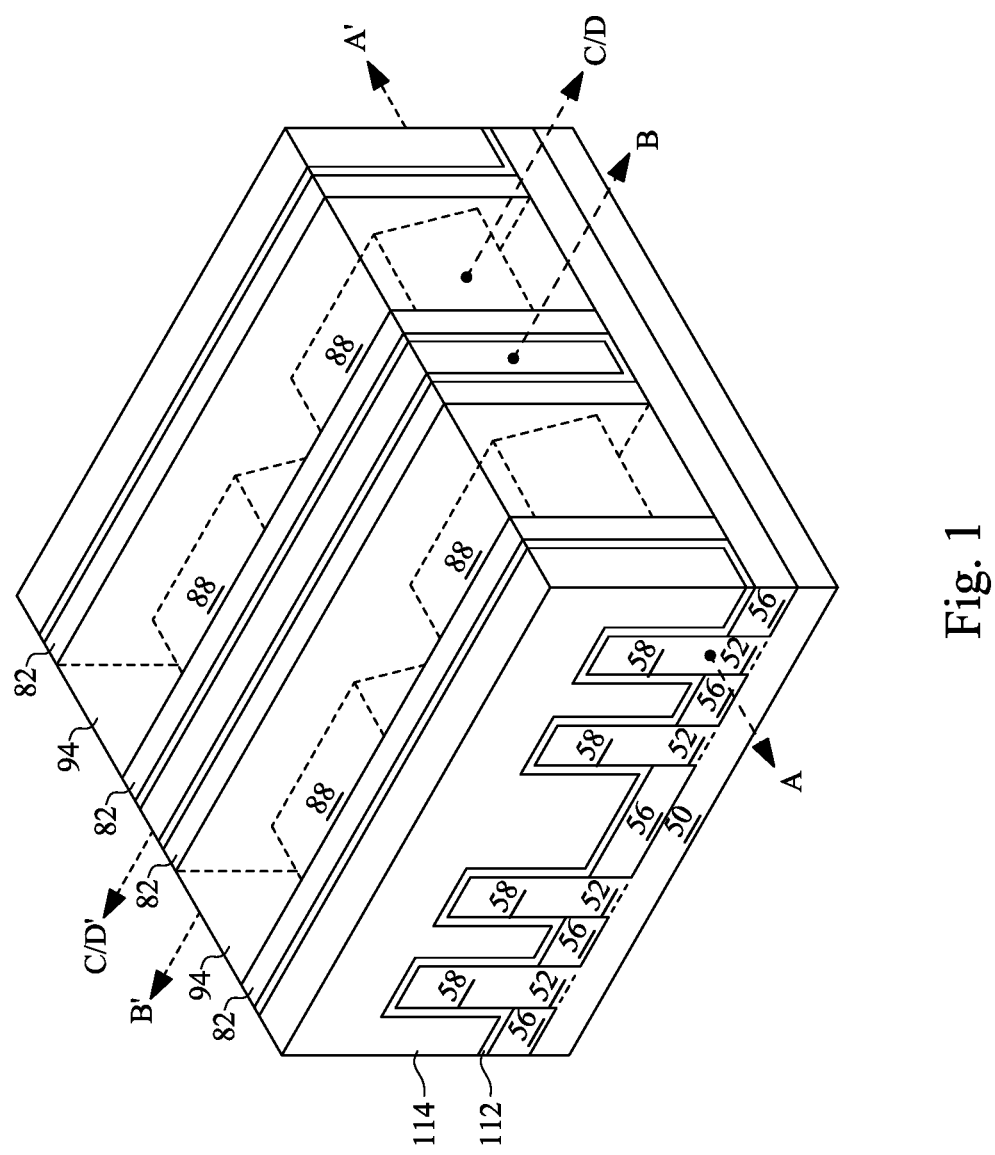
FIG. 1 illustrates an example of Fin Field-Effect Transistors (FinFETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a gate structure (including a gate dielectric and a gate electrode) is divided (or "cut") into multiple gate structures. Dividing a gate structure includes forming an isolation structure extending through the gate structure so as to cut the gate structure into multiple gate structures. The isolation structure is formed by patterning an opening in the gate structure, forming a dielectric material in the opening, and then treating the dielectric material. Treating the dielectric material shrinks (i.e., reduces the width and/or height of) any seams or voids that may be in the isolation structure. Shrinking seams/voids in the isolation structure can reduce the risk of conductive materials being formed in the seams/voids during subsequent processing, which can help reduce the risk of shorting the source/drain regions of the devices. The reliability of the resulting devices may thus be improved.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include fins 52 extending above a primary surface of a substrate 50 (e.g., a semiconductor substrate), with the fins 52 acting as channel regions 58 for the FinFETs. Isolation regions 56, such as shallow trench isolation (STI) regions, are disposed between adjacent fins 52, which may protrude above and from between adjacent isolation regions 56. The isolation regions 56 between the fins 52 are fin isolation structures. Although the isolation regions 56 are described/illustrated as being separate from the substrate 50, as used herein, the term "substrate" may refer to the semiconductor substrate alone or a combination of the semiconductor substrate and the isolation regions. Additionally, although the bottom portions of the fins 52 are illustrated as being single, continuous materials with the substrate 50, the bottom portions of the fins 52 and/or the substrate 50 may include a single material or a plurality of materials.

Gate dielectrics 112 are along sidewalls and over top surfaces of the fins 52. Gate electrodes 114 are over the gate dielectrics 112. Source/drain regions 88 are disposed in opposite sides of the fins 52 with respect to the gate dielectrics 112 and the gate electrodes 114. Source/drain region(s) 88 may refer to a source or a drain, individually or collectively dependent upon the context. Gate spacers 82 separate the source/drain regions 88 from the gate dielectrics 112 and the gate electrodes 114. An inter-layer dielectric (ILD) 94 is formed over the source/drain regions 88. Contacts (subsequently described) to the source/drain regions 88 will be formed through the ILD 94. The source/drain regions 88 may be shared between various fins 52. For example, adjacent source/drain regions 88 may be electrically connected, such as through coalescing the source/drain regions 88 by epitaxial growth, or through coupling the source/drain regions 88 with a same source/drain contact.

FIG. 1 further illustrates reference cross-sections that are used in later figures. Cross-section A-A' is along a longitudinal axis of a fin 52 and in a direction of, for example, a current flow between the source/drain regions 88 of a FinFET. Cross-section B-B' is perpendicular to cross-section A-A' and is along a longitudinal axis of a gate electrode 114. Cross-section C/D-C/D' is parallel to cross-section B-B' and extends through source/drain regions of the FinFETs. Subsequent figures refer to these reference cross-sections for clarity.

Some embodiments discussed herein are discussed in the context of FinFETs formed using a gate-last process. In other embodiments, a gate-first process may be used.

FIGS. 2-19C are views of intermediate stages in the manufacturing of FinFETs, in accordance with some embodiments. FIGS. 2, 3, 4, and 5 are three-dimensional views showing a similar three-dimensional view as FIG. 1. FIGS. 6A, 7A, 8A, 9A, 10A, 11A, 12A, 13A, 14A, 15A, 16A, 17A, 18A, and 19A are cross-sectional views illustrated along a similar cross-section as reference cross-section A-A' in FIG. 1. FIGS. 6B, 7B, 8B, 9B, 10B, 11B, 12B, 13B, 14B, 15B, 16B, 17B, 18B, and 19B are cross-sectional views illustrated along a similar cross-section as reference cross-section B-B' in FIG. 1. FIGS. 7C and 7D are cross-sectional views illustrated along a similar cross-section as reference cross-section C/D-C/D' in FIG. 1. FIGS. 13C, 14C, 15C, 16C, 17C, 18C, and 19C are top-down views along a gate structure, where some features are omitted or shown in ghost for illustration clarity.

Figure 2:
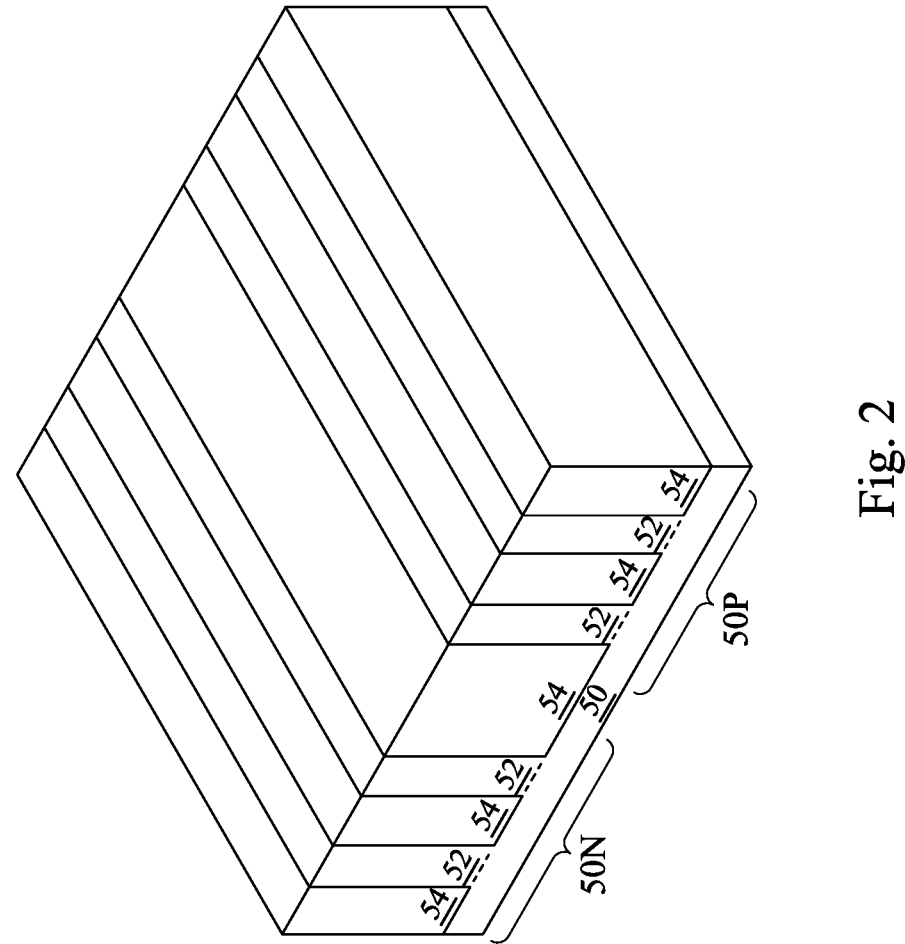
FIGS. 2-19C are views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Fins 52 are formed in the substrate 50. The fins 52 are semiconductor strips, and may also be referred to as semiconductor fin. The fins 52 may be formed in the substrate 50 by etching trenches in the substrate 50. The etching may be any acceptable etching process, such as a reactive ion etch (RIE), neutral beam etch (NBE), the like, or a combination thereof. The etching process may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

An insulation material 54 is formed over the substrate 50 and between neighboring fins 52. The insulation material 54 may be an oxide, such as silicon oxide, a nitride, the like, or a combination thereof, and may be formed by a chemical vapor deposition (CVD) process, such as a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, the insulation material 54 is silicon oxide formed by a FCVD process. An anneal process may be performed once the insulation material is formed. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as one of the insulation materials previously described may be formed over the liner.

In an embodiment, the insulation material 54 is formed such that excess insulation material 54 covers the fins 52. A removal process is applied to the insulation material 54 to remove excess insulation material 54 over the fins 52. In some embodiments, a planarization process such as a chemical mechanical polish (CMP), an etch-back process, combinations thereof, or the like is utilized. The planarization process exposes the fins 52 such that top surfaces of the fins 52 and the insulation material 54 are substantially coplanar (within process variations) after the planarization process is complete. In embodiments in which a mask remains on the fins 52, the planarization process may expose the mask or remove the mask such that top surfaces of the mask or the fins 52, respectively, and the insulation material 54 are substantially coplanar (within process variations) after the planarization process is complete The previously described process is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches to form the fins 52. Additionally, in some embodiments, heteroepitaxial structures can be used for the fins 52. For example, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50 to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region 50N (e.g., an NMOS region) different from the material in the p-type region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Figure 3:
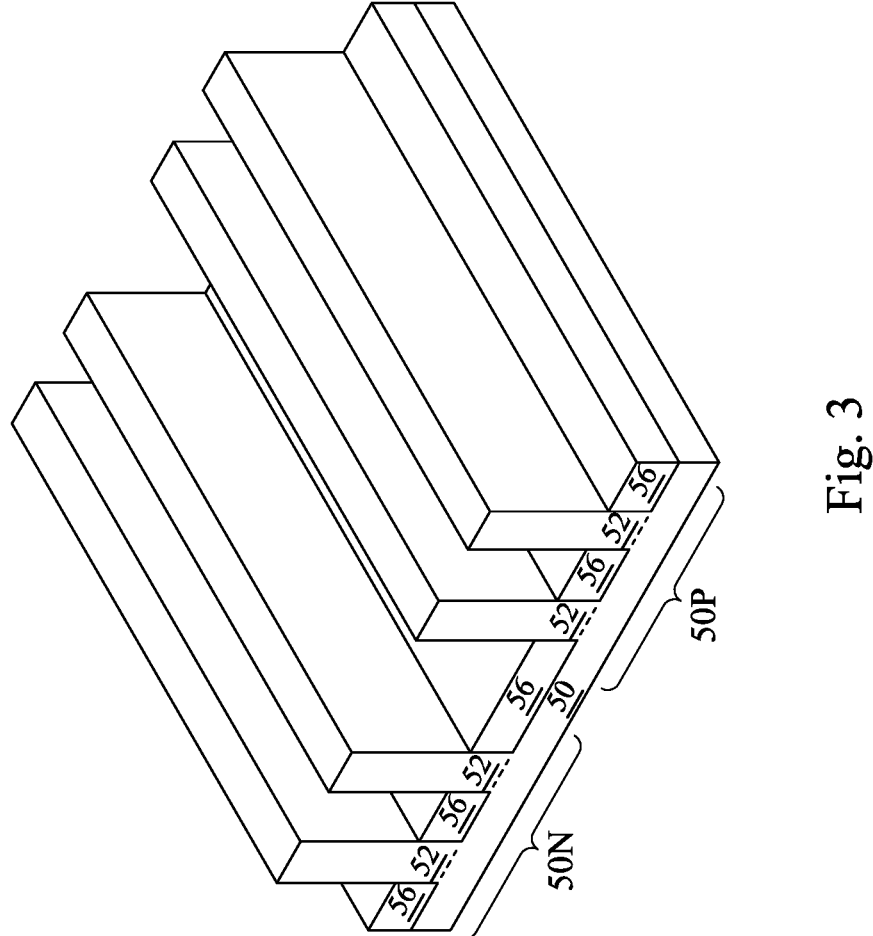

In FIG. 3, the insulation material 54 is recessed to form STI regions 56. The insulation material 54 is recessed such that upper portions of the fins 52 protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal may be performed using dilute hydrofluoric (dHF) acid.

Further, appropriate wells (not separately illustrated) may be formed in the fins 52 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In the embodiments with different well types, the different implant steps for the n-type region 50N and the p-type region 50P may be achieved using a mask (not separately illustrated) such as a photoresist. For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following or prior to the implanting of the p-type region 50P, a mask (not separately illustrated) such as a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 52, the grown materials may be in situ doped during growth, which may obviate the implantations, although in situ and implantation doping may be used together.

Figure 4:
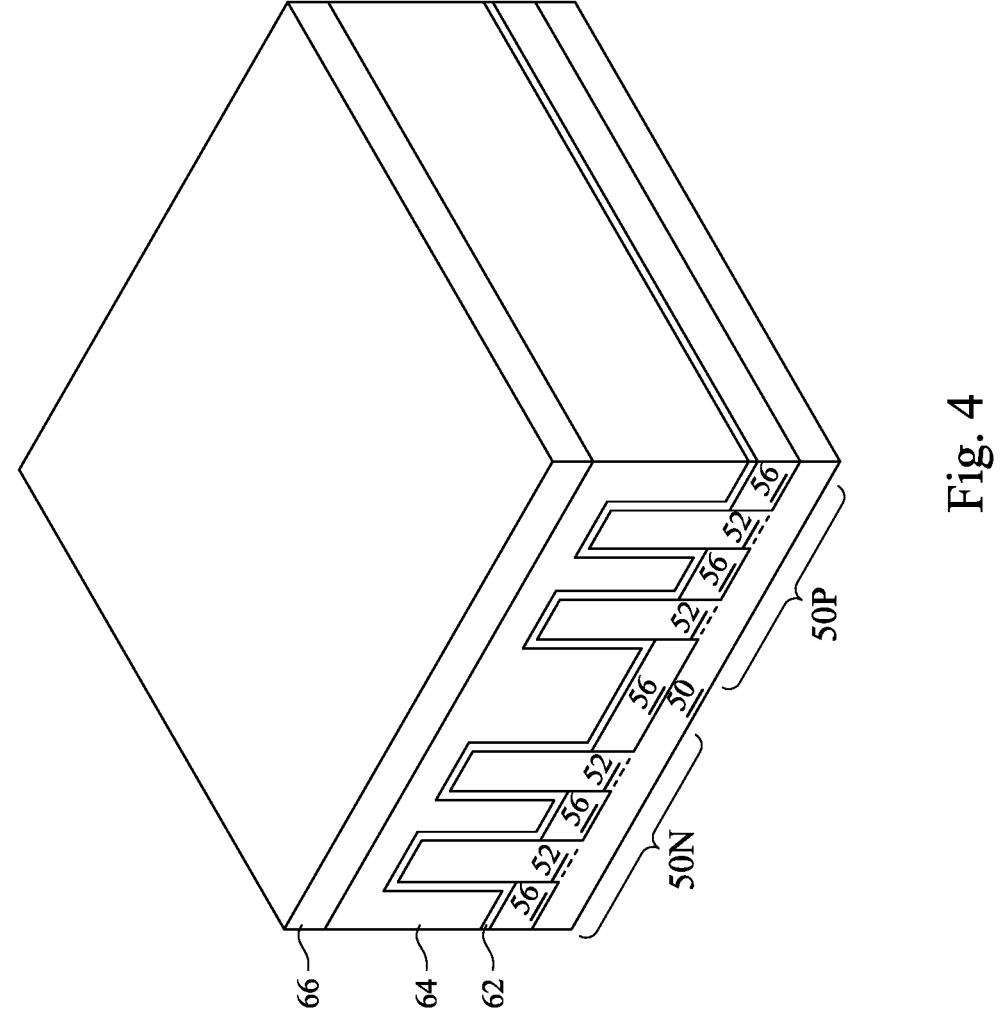

In FIG. 4, a dummy dielectric layer 62 is formed on the fins 52. The dummy dielectric layer 62 may be formed of a dielectric material such as silicon oxide, silicon nitride, a combination thereof, or the like, which may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be formed of a conductive or non-conductive material, such as amorphous silicon, polycrystalline-silicon (polysilicon), polycrystalline silicon-germanium (poly-SiGe), a metal, a metallic nitride, a metallic silicide, a metallic oxide, or the like, which may be deposited by physical vapor deposition (PVD), CVD, or the like. The dummy gate layer 64 may be formed of material(s) that have a high etching selectivity from insulation materials, e.g., the STI regions 56 and/or the dummy dielectric layer 62. The mask layer 66 may be formed of a dielectric material such as silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the fins 52 and the STI regions 56, such that the dummy dielectric layer 62 extends over the STI regions 56 and between the dummy gate layer 64 and the STI regions 56. In another embodiment, the dummy dielectric layer 62 covers only the fins 52.

Figure 5:
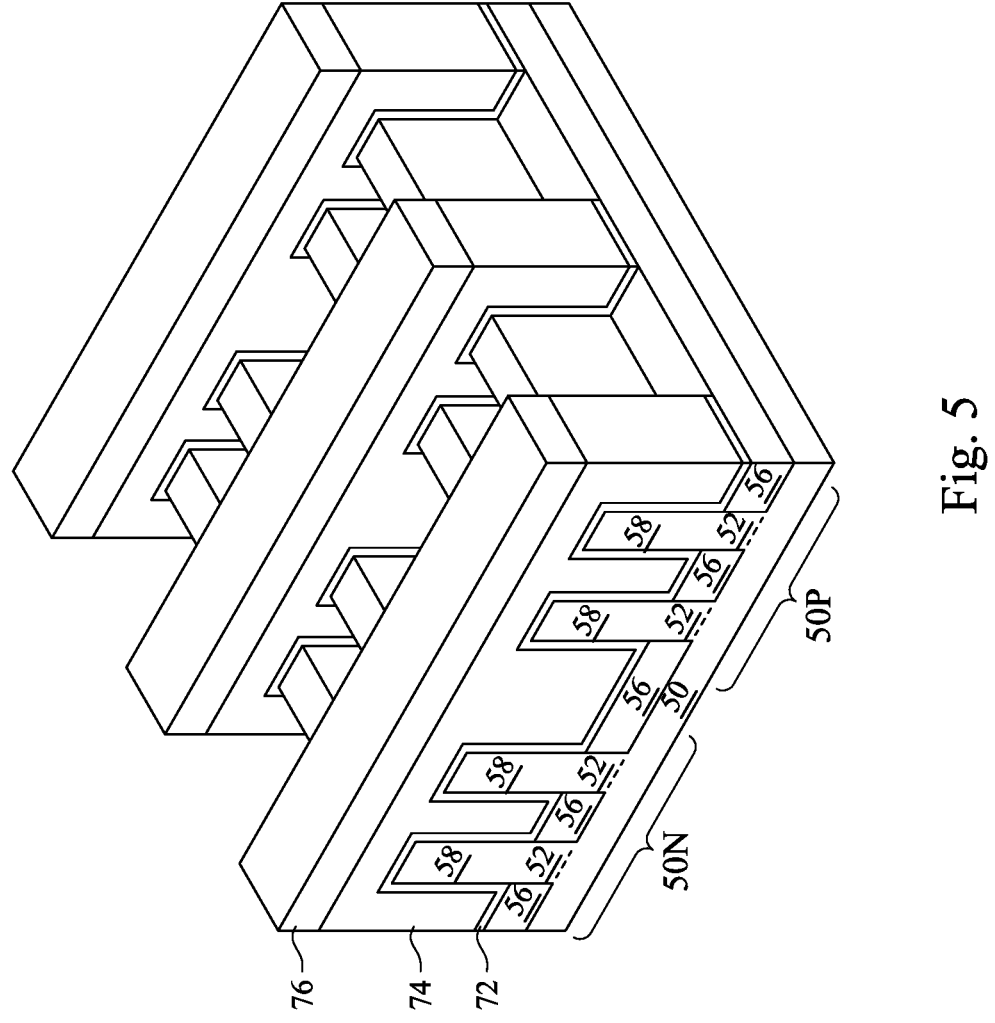

In FIG. 5, the mask layer 66 is patterned using acceptable photolithography and etching techniques to form masks 76. The pattern of the masks 76 is then transferred to the dummy gate layer 64 by any acceptable etching technique to form dummy gates 74. The pattern of the masks 76 may optionally be further transferred to the dummy dielectric layer 62 by any acceptable etching technique to form dummy dielectrics 72. The dummy gates 74 cover respective channel regions 58 of the fins 52. The pattern of the masks 76 may be used to physically separate adjacent dummy gates 74. The dummy gates 74 may also have lengthwise directions substantially perpendicular (within process variations) to the lengthwise directions of the fins 52. The masks 76 may be removed during the patterning of the dummy gate 74, or may be removed during subsequent processing.

FIGS. 6A-19C illustrate various additional steps in the manufacturing of embodiment devices. FIGS. 6A-19C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figure 6A:
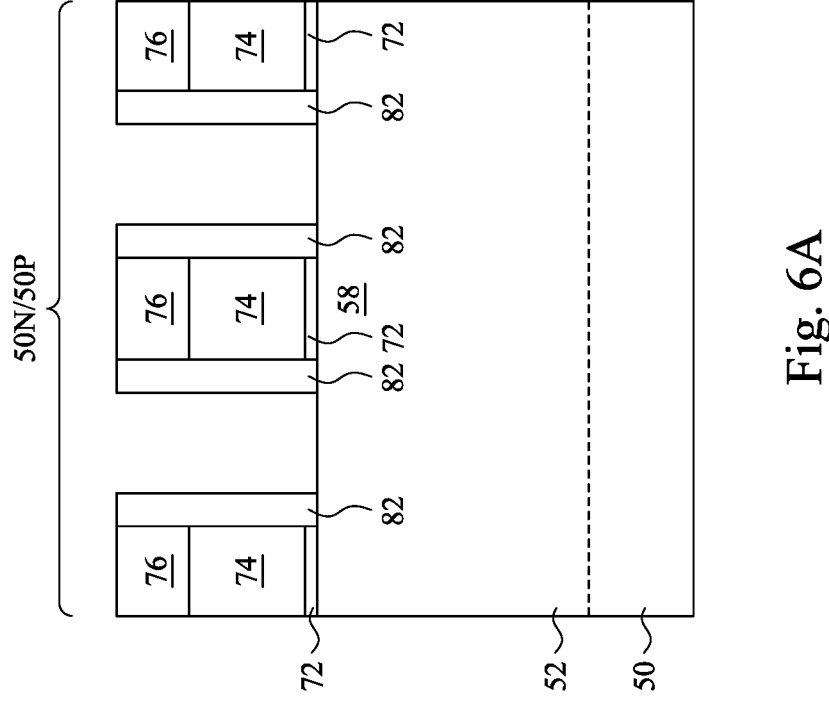
Figure 6B:
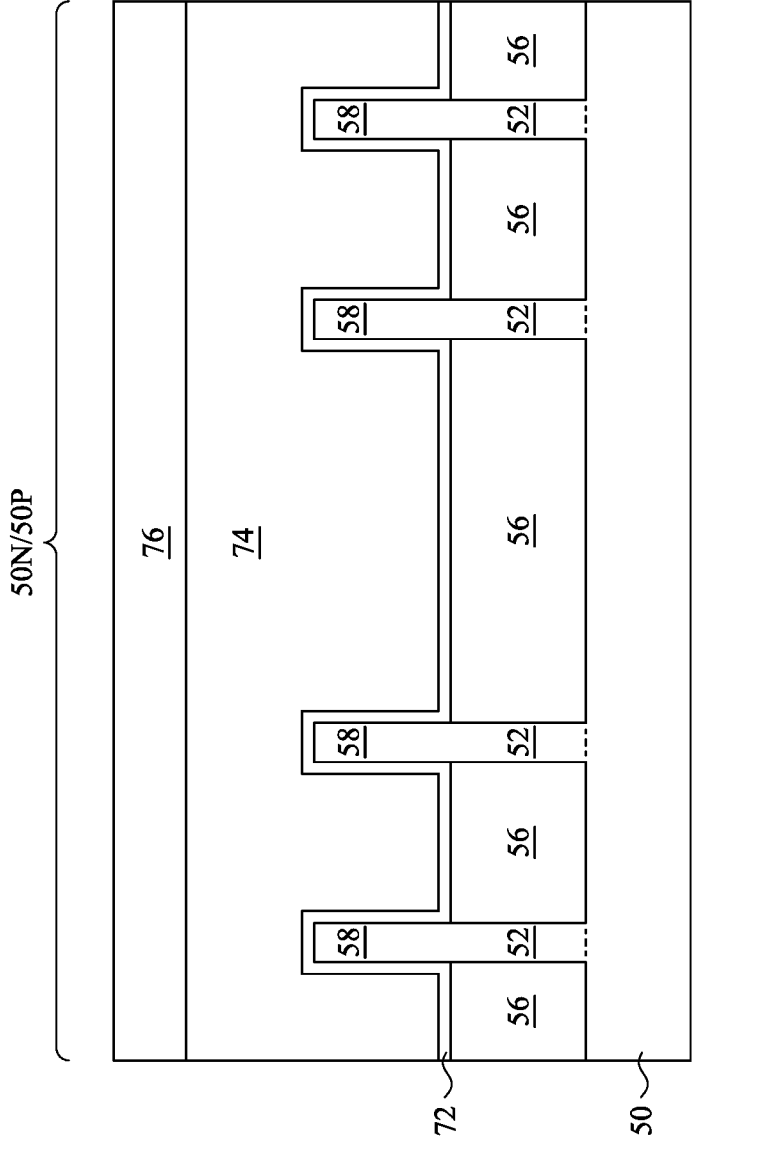

In FIGS. 6A-6B, gate spacers 82 are formed over the fins 52 and on exposed sidewalls of the masks 76 (if present), the dummy gates 74, and the dummy dielectrics 72. The gate spacers 82 may be formed by conformally depositing one or more dielectric material(s) and subsequently etching the dielectric material(s). Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other dielectric materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 82, see FIG. 6A). In some embodiments the etch used to form the gate spacers 82 is adjusted so that the dielectric material(s), when etched, also have portions left on the sidewalls of the fins 52 (thus forming fin spacers 84, see FIGS. 7C-7D). After etching, the fin spacers 84 (if present) and the gate spacers 82 can have straight sidewalls (as illustrated) or can have rounded sidewalls (not separately illustrated).

Further, implants may be performed to form lightly doped source/drain (LDD) regions (not separately illustrated) in the fins 52. In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 52 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 52 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 74, so that the channel regions 58 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, spacers may be formed and removed, and/or the like. Furthermore, the n-type and p-type devices may be formed using different structures and steps.

Figure 7A:
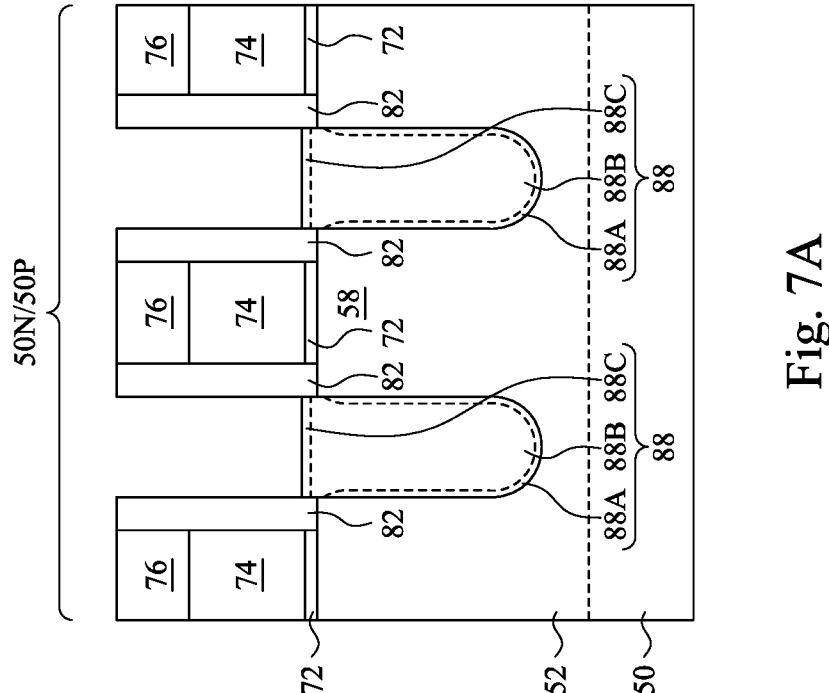
Figure 7B:
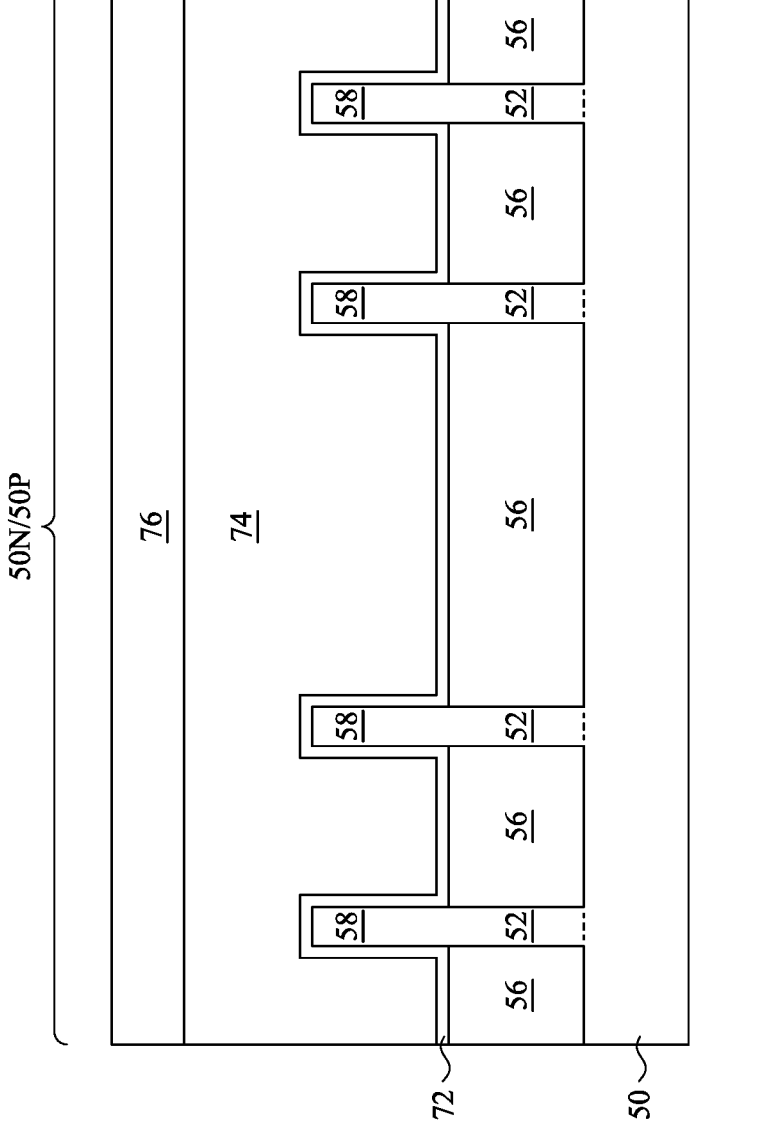
Figure 7C:
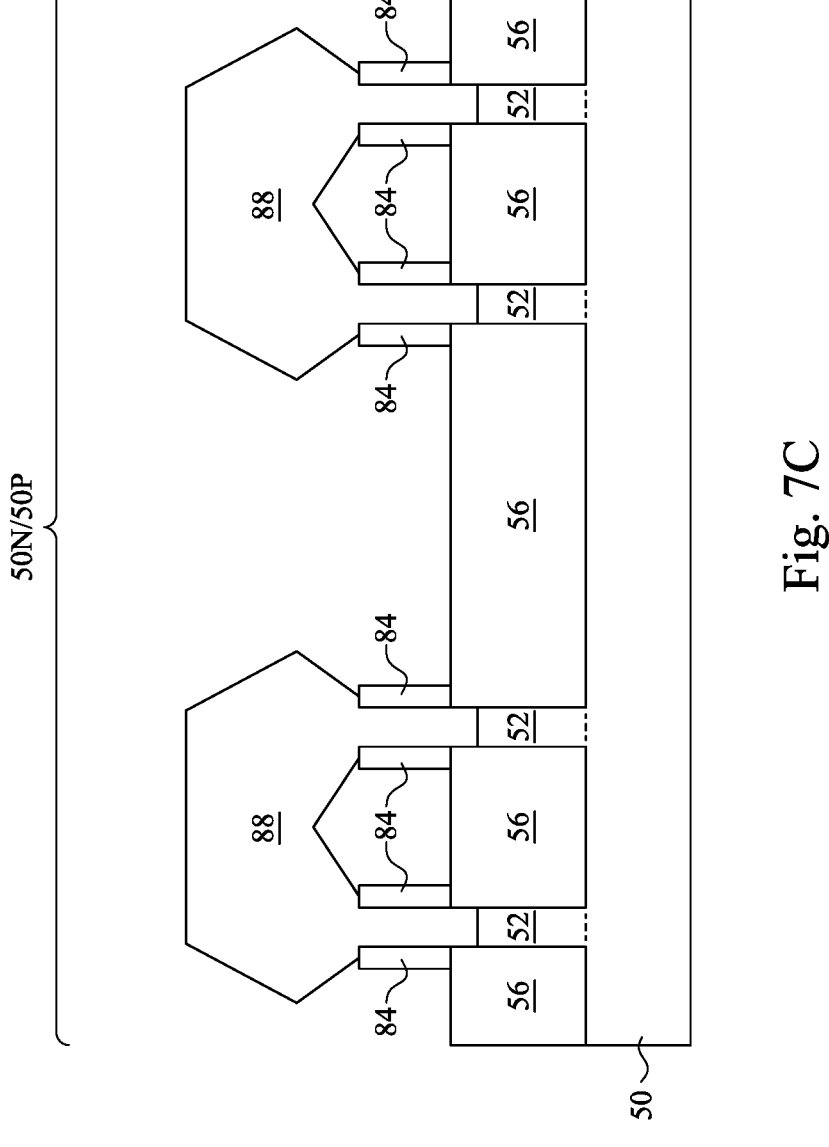
Figure 7D:
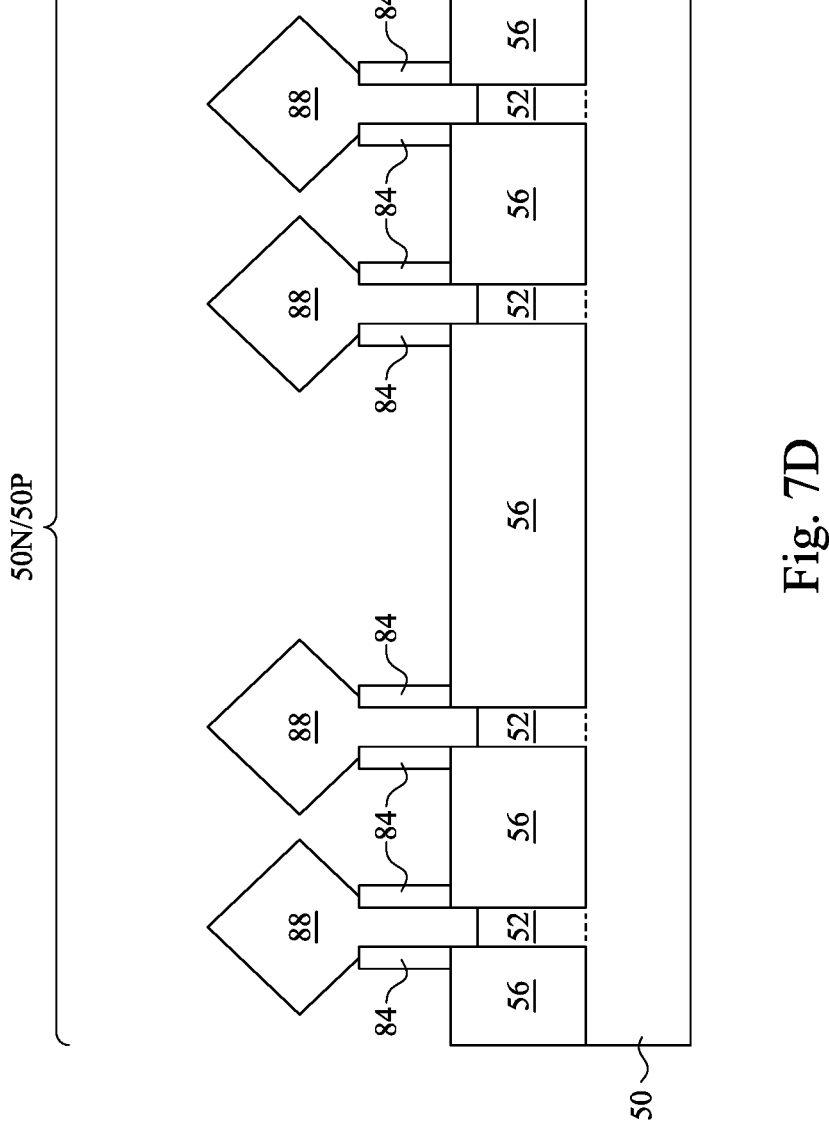

In FIGS. 7A-7B, epitaxial source/drain regions 88 are formed in the fins 52. The epitaxial source/drain regions 88 are formed in the fins 52 such that each dummy gate 74 is disposed between respective neighboring pairs of the epitaxial source/drain regions 88. In some embodiments the epitaxial source/drain regions 88 may extend into, and may also penetrate through, the fins 52. In some embodiments, the gate spacers 82 are used to separate the epitaxial source/drain regions 88 from the dummy gates 74 by an appropriate lateral distance so that the epitaxial source/drain regions 88 do not short out subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P and etching source/drain regions of the fins 52 in the n-type region 50N to form recesses in the fins 52. Then, the epitaxial source/drain regions 88 in the n-type region 50N are epitaxially grown in the recesses. The epitaxial source/drain regions 88 may include any acceptable material appropriate for n-type devices. For example, if the fins 52 are silicon, the epitaxial source/drain regions 88 in the n-type region 50N may include materials exerting a tensile strain on the channel regions 58, such as silicon, silicon carbide, phosphorous-doped silicon, phosphorous-doped silicon carbide, silicon phosphide, or the like. The epitaxial source/drain regions 88 in the n-type region 50N may be referred to as "n-type source/drain regions." The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N and etching source/drain regions of the fins 52 in the p-type region 50P to form recesses in the fins 52. Then, the epitaxial source/drain regions 88 in the p-type region 50P are epitaxially grown in the recesses. The epitaxial source/drain regions 88 may include any acceptable material appropriate for p-type devices. For example, if the fins 52 are silicon, the epitaxial source/drain regions 88 in the p-type region 50P may include materials exerting a compressive strain on the channel regions 58, such as silicon germanium, boron-doped silicon germanium, germanium, germanium tin, or the like. The epitaxial source/drain regions 88 in the p-type region 50P may be referred to as "p-type source/drain regions." The epitaxial source/drain regions 88 in the p-type region 50P may have surfaces raised from respective surfaces of the fins 52 and may have facets.

The epitaxial source/drain regions 88 and/or the fins 52 may be implanted with dopants to form source/drain regions, similar to the process previously discussed for forming lightly-doped source/drain regions, followed by an anneal. The source/drain regions may have an impurity concentration of between $10^{19}$ cm$^{-3}$ and $10^{21}$ cm$^{-3}$. The n-type and/or p-type impurities for source/drain regions may be any of the impurities previously discussed. In some embodiments, the epitaxial source/drain regions 88 may be in situ doped during growth.

As a result of the epitaxy processes used to form the epitaxial source/drain regions 88, upper surfaces of the epitaxial source/drain regions have facets which expand laterally outward beyond sidewalls of the fins 52. In some embodiments, these facets cause adjacent epitaxial source/drain regions 88 to merge, as illustrated by FIG. 7C. In some embodiments, adjacent epitaxial source/drain regions 88 remain separated after the epitaxy process is completed, as illustrated by FIG. 7D. In the illustrated embodiments, fin spacers 84 are formed to cover a portion of the sidewalls of the fins 52 that extend above the STI regions 56, thereby blocking the epitaxial growth. In another embodiment, the spacer etch used to form the gate spacers 82 is adjusted to not form the fin spacers 84, so as to allow the epitaxial source/drain regions 88 to extend to the surface of the STI regions 56.

Figure 8A:
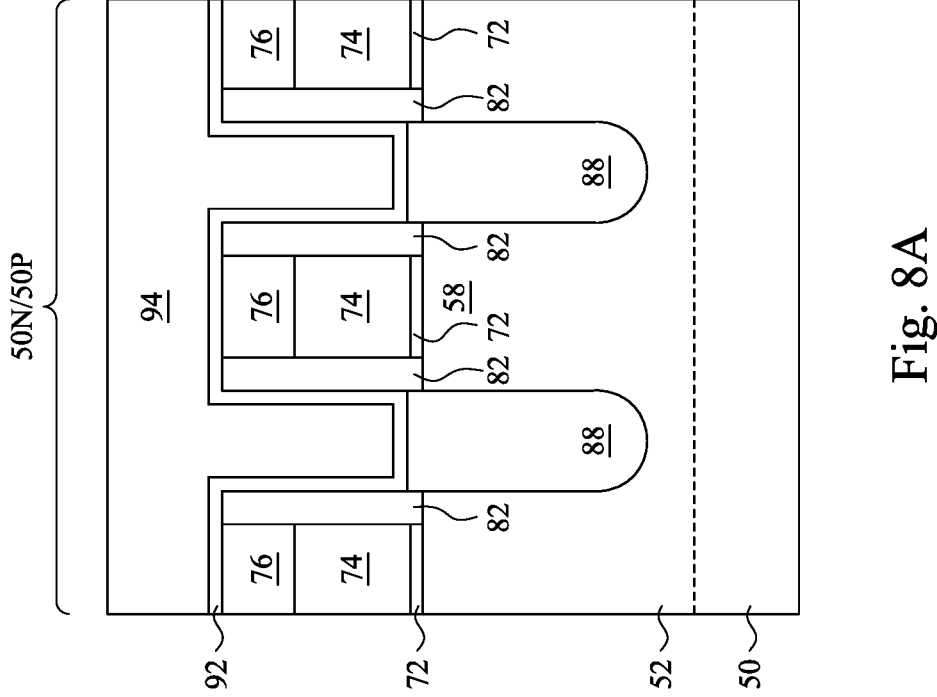
Figure 8B:
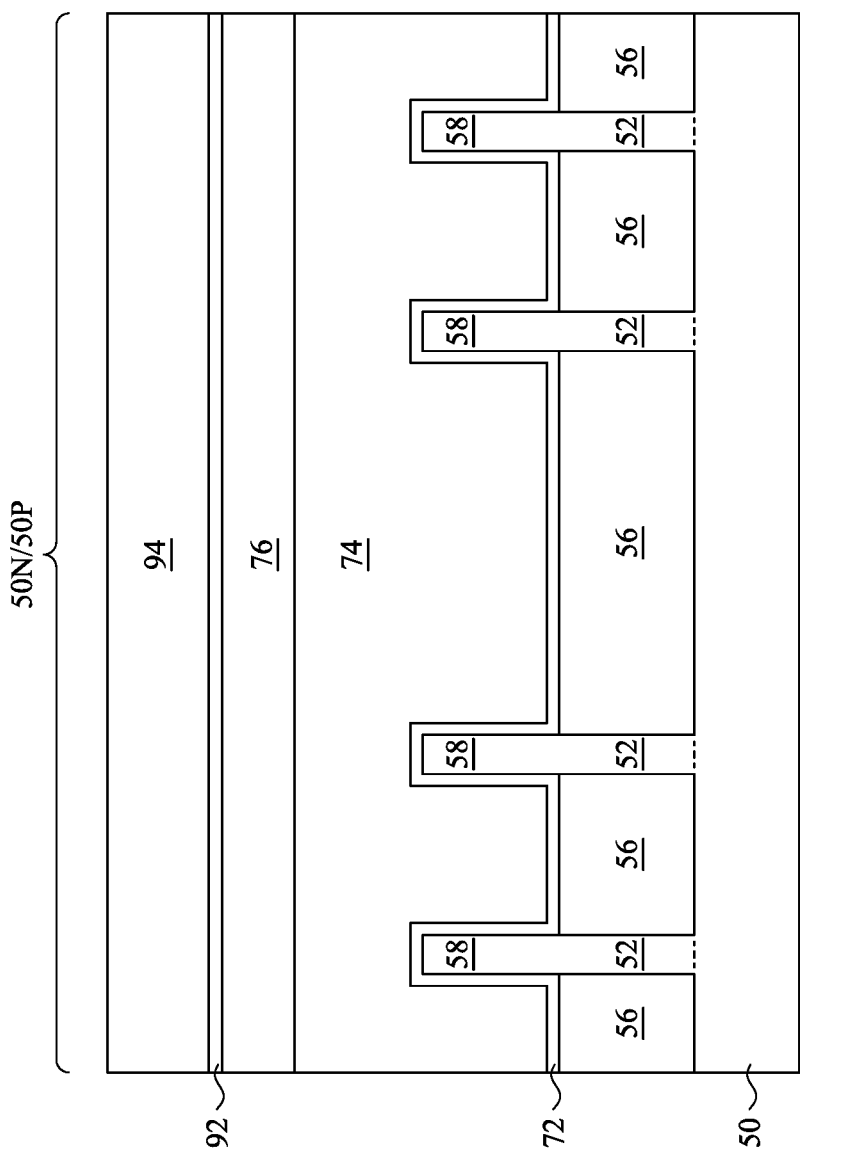

In FIGS. 8A-8B, a first ILD 94 is deposited over the epitaxial source/drain regions 88, the gate spacers 82, and the masks 76 (if present) or the dummy gates 74. The first ILD 94 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other dielectric materials formed by any acceptable process may be used.

In some embodiments, a contact etch stop layer (CESL) 92 is formed between the first ILD 94 and the epitaxial source/drain regions 88, the gate spacers 82, and the masks 76 (if present) or the dummy gates 74. The CESL 92 may be formed of a dielectric material having a high etching selectivity from the first ILD 94. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like.

Figure 9A:
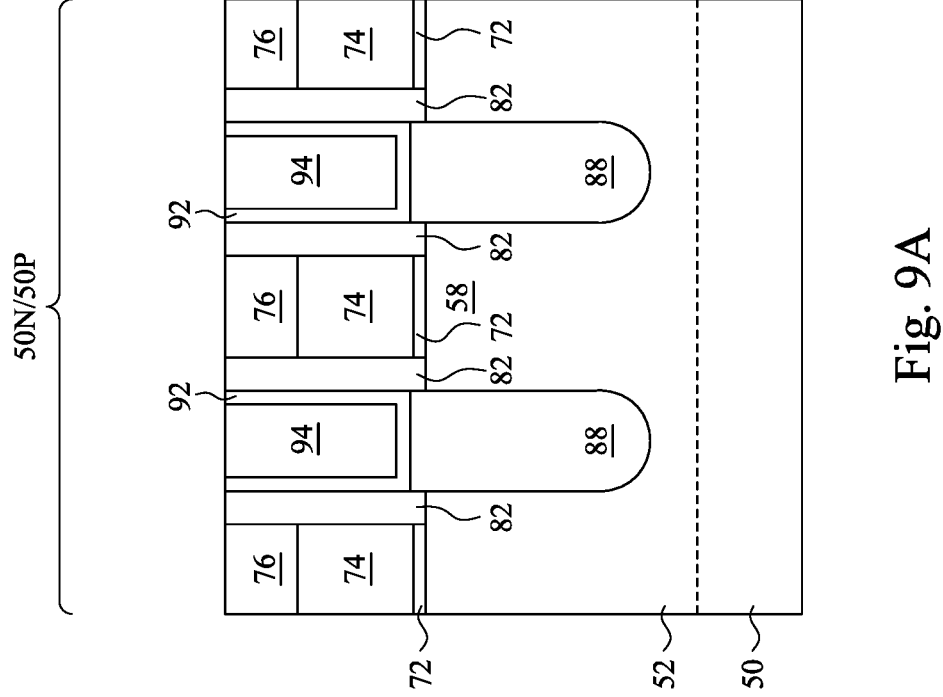
Figure 9B:
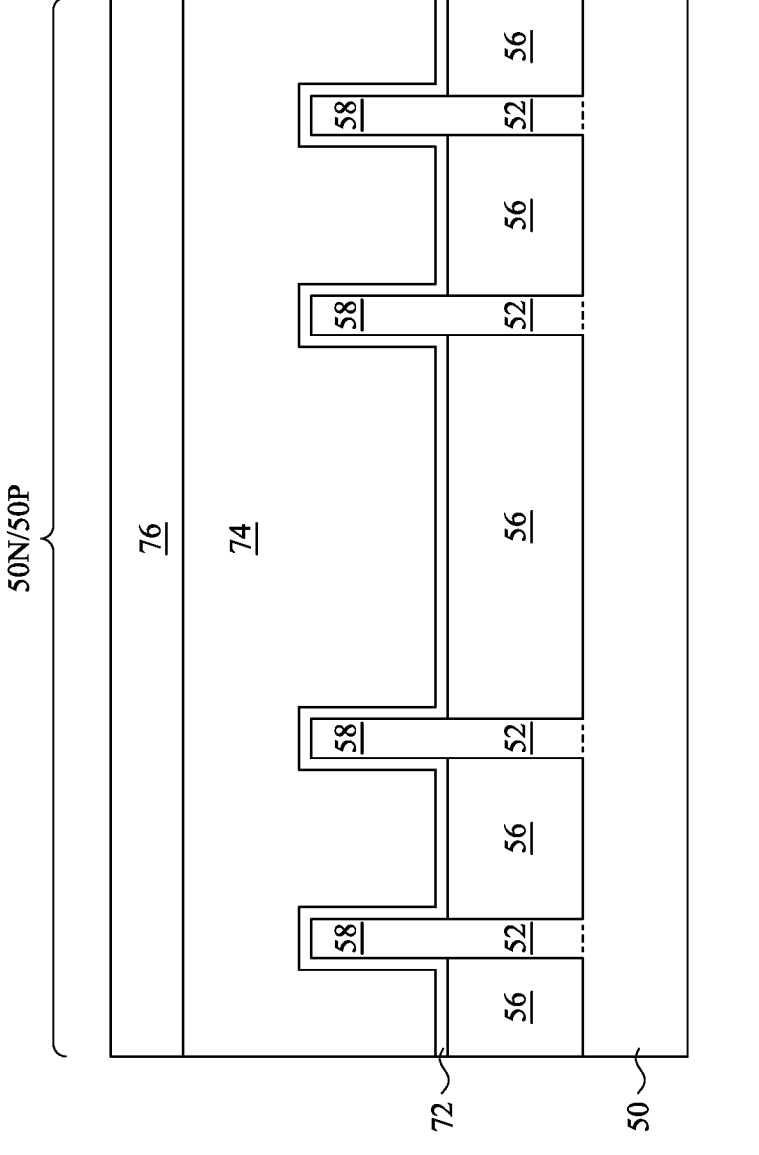

In FIGS. 9A-9B, a removal process is performed to level the top surfaces of the first ILD 94 with the top surfaces of the masks 76 (if present) or the dummy gates 74. In some embodiments, a planarization process such as a chemical mechanical polish (CMP), an etch-back process, combinations thereof, or the like is utilized. The planarization process may also remove the masks 76 on the dummy gates 74, and portions of the gate spacers 82 along sidewalls of the masks 76. After the planarization process, the top surfaces of the first ILD 94, the CESL 92, the gate spacers 82, and the masks 76 (if present) or the dummy gates 74 are substantially coplanar (within process variations). Accordingly, the top surfaces of the masks 76 (if present) or the dummy gates 74 are exposed through the first ILD 94. In the illustrated embodiment, the masks 76 remain, and the planarization process levels the top surfaces of the first ILD 94 with the top surfaces of the masks 76.

Figure 10A:
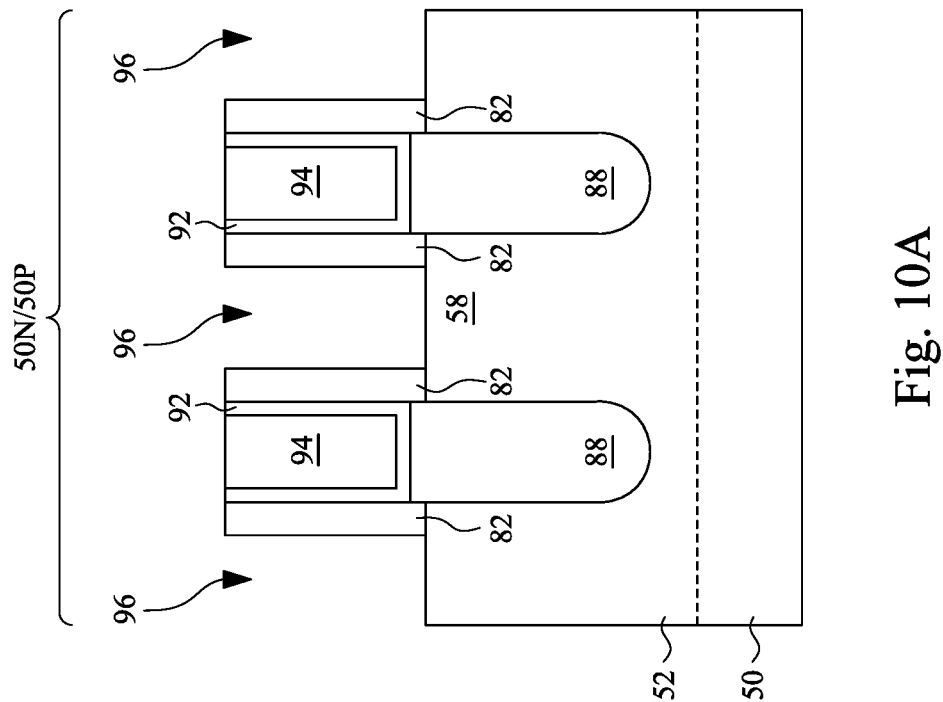
Figure 10B:
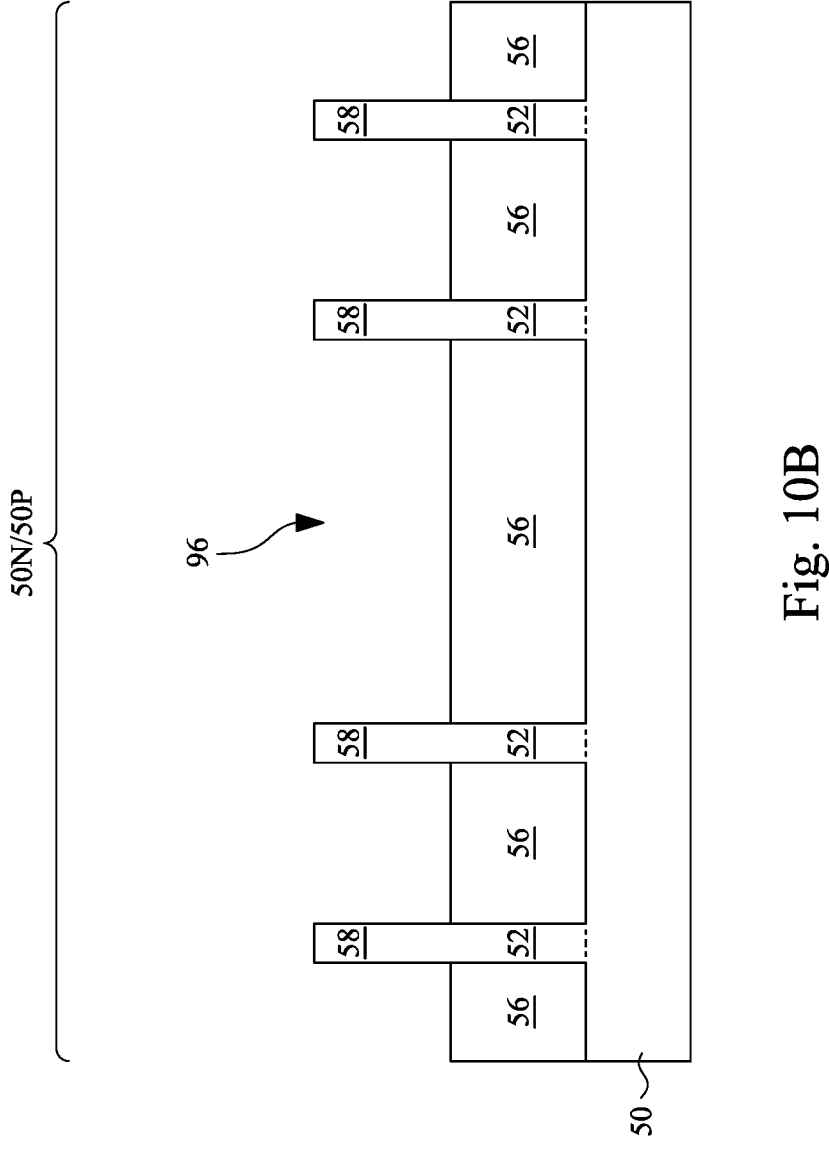

In FIGS. 10A-10B, the masks 76 (if present) and the dummy gates 74 are removed in an etching process, so that recesses 96 are formed. Portions of the dummy dielectrics 72 in the recesses 96 may also be removed. In some embodiments, only the dummy gates 74 are removed and the dummy dielectrics 72 remain and are exposed by the recesses 96. In some embodiments, the dummy dielectrics 72 are removed from recesses 96 in a first region of a die (e.g., a core logic region) and remain in recesses 96 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the first ILD 94 or the gate spacers 82. During the removal, the dummy dielectrics 72 may be used as etch stop layers when the dummy gates 74 are etched. The dummy dielectrics 72 may then be optionally removed after the removal of the dummy gates 74. Each recess 96 exposes and/or overlies a channel region 58 of a respective fin 52.

Figure 11A:
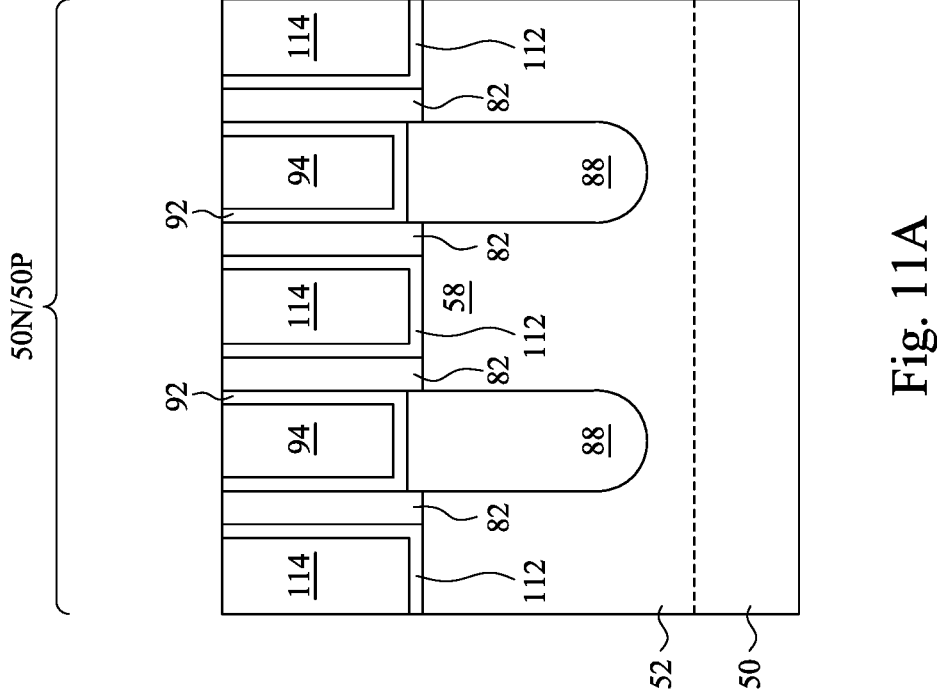
Figure 11B:
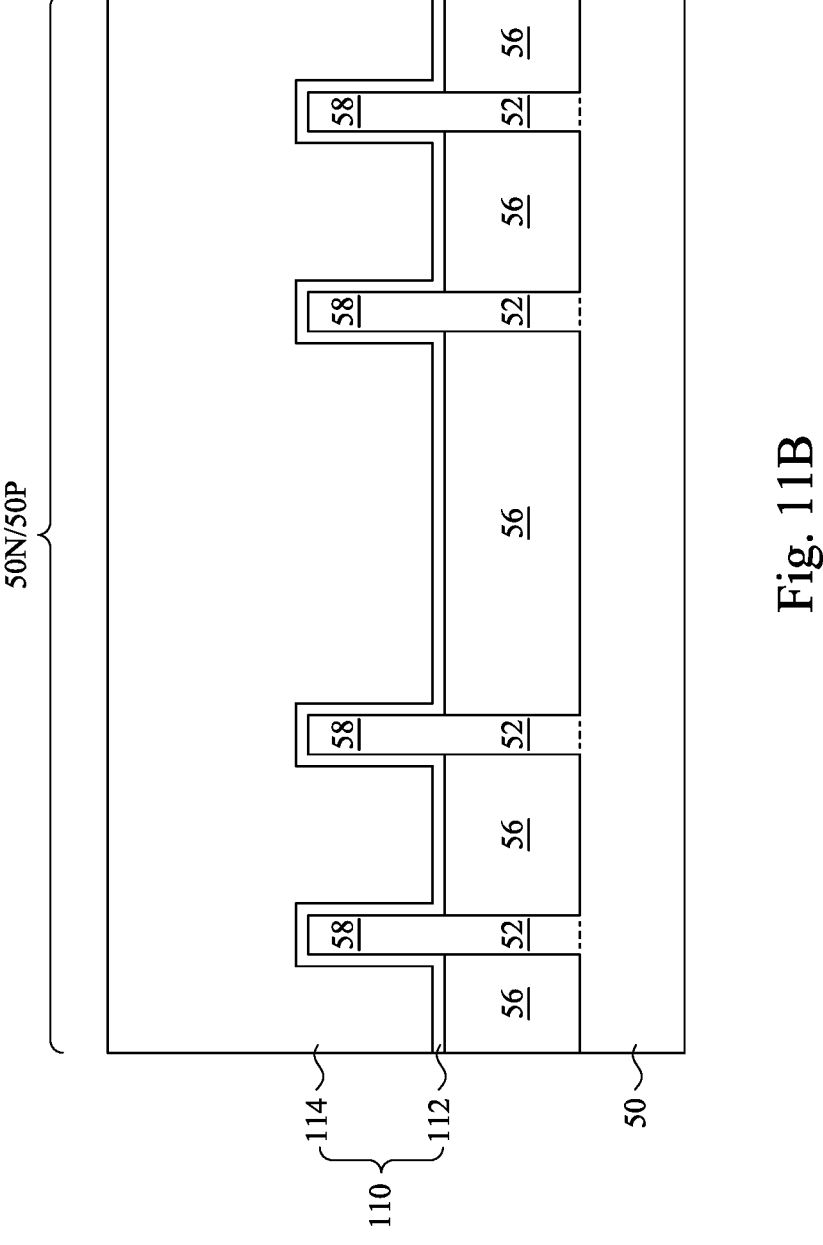

In FIGS. 11A-11B, gate dielectrics 112 and gate electrodes 114 are formed for replacement gate structures. Each pair of a gate dielectric 112 and a gate electrode 114 may be collectively referred to as a gate structure 110 (see FIG. 11B). Each gate structure 110 extends along sidewalls and a top surface of a channel region 58 of a fin 52. The gate structures 110 are also on the STI regions 56.

The gate dielectrics 112 include one or more gate dielectric layer(s) disposed on top surfaces and the sidewalls of the fins 52, and on the sidewalls of the gate spacers 82. The gate dielectrics 112 may be formed of an oxide such as silicon oxide or a metal oxide, a silicate such as a metal silicate, combinations thereof, multi-layers thereof, or the like. Additionally or alternatively, the gate dielectrics 112 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 112 may be formed by molecular-beam deposition (MBD), ALD, PECVD, or the like. Although a single-layered gate dielectrics 112 are illustrated, the gate dielectrics 112 may include any number of interfacial layers and any number of main layers. For example, the gate dielectrics 112 may include an interfacial layer and an overlying high-k dielectric layer.

The gate electrodes 114 include one or more gate electrode layer(s) disposed over the gate dielectrics 112. The gate electrodes 114 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 114 are illustrated, the gate electrodes 114 may include any number of work function tuning layers, any number of barrier layers, any number of glue layers, and a fill material.

As an example to form the gate structures 110, one or more gate dielectric layer(s) may be deposited in the recesses 96. The gate dielectric layer(s) may also be deposited on the top surfaces of the first ILD 94, the CESL 92, and the gate spacers 82. Subsequently, one or more gate electrode layer(s) may be deposited on the gate dielectric layer(s), and in the remaining portions of the recesses 96. A removal process may then be performed to remove the excess portions of the gate dielectric layer(s) and the gate electrode layer(s), which excess portions are over the top surfaces of the first ILD 94, the CESL 92, and the gate spacers 82. The gate dielectric layer(s), after the removal process, have portions left in the recesses 96 (thus forming the gate dielectrics 112). The gate electrode layer(s), after the removal process, have portions left in the recesses 96 (thus forming the gate electrodes 114). In some embodiments, a planarization process such as a chemical mechanical polish (CMP), an etch-back process, combinations thereof, or the like is utilized. After the planarization process, the top surfaces of the gate spacers 82, the CESL 92, the first ILD 94, and the gate structures 110 (including the gate dielectrics 112 and the gate electrodes 114) are substantially coplanar (within process variations).

The formation of the gate dielectrics 112 in the n-type region 50N and the p-type region 50P may occur simultaneously such that the gate dielectrics 112 in each region are formed of the same material(s), and the formation of the gate electrodes 114 may occur simultaneously such that the gate electrodes 114 in each region are formed of the same material(s). In some embodiments, the gate dielectrics 112 in each region may be formed by distinct processes, such that the gate dielectrics 112 may include different materials and/or have a different number of layers, and/or the gate electrodes 114 in each region may be formed by distinct processes, such that the gate electrodes 114 may include different materials and/or have a different number of layers. Various masking steps may be used to mask and expose appropriate regions when using distinct processes.

Figure 12A:
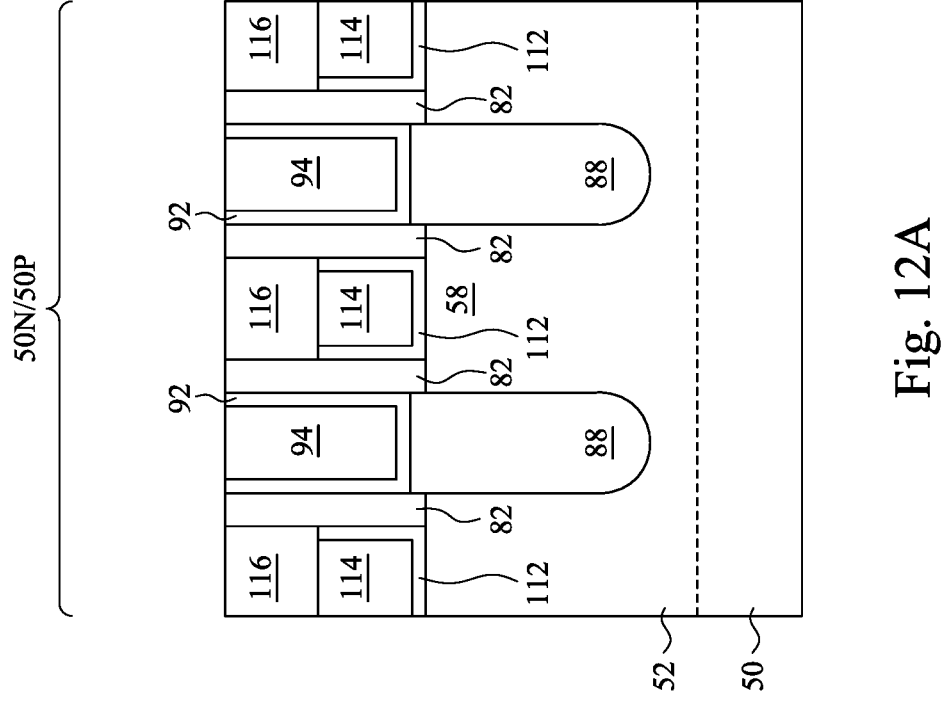
Figure 12B:
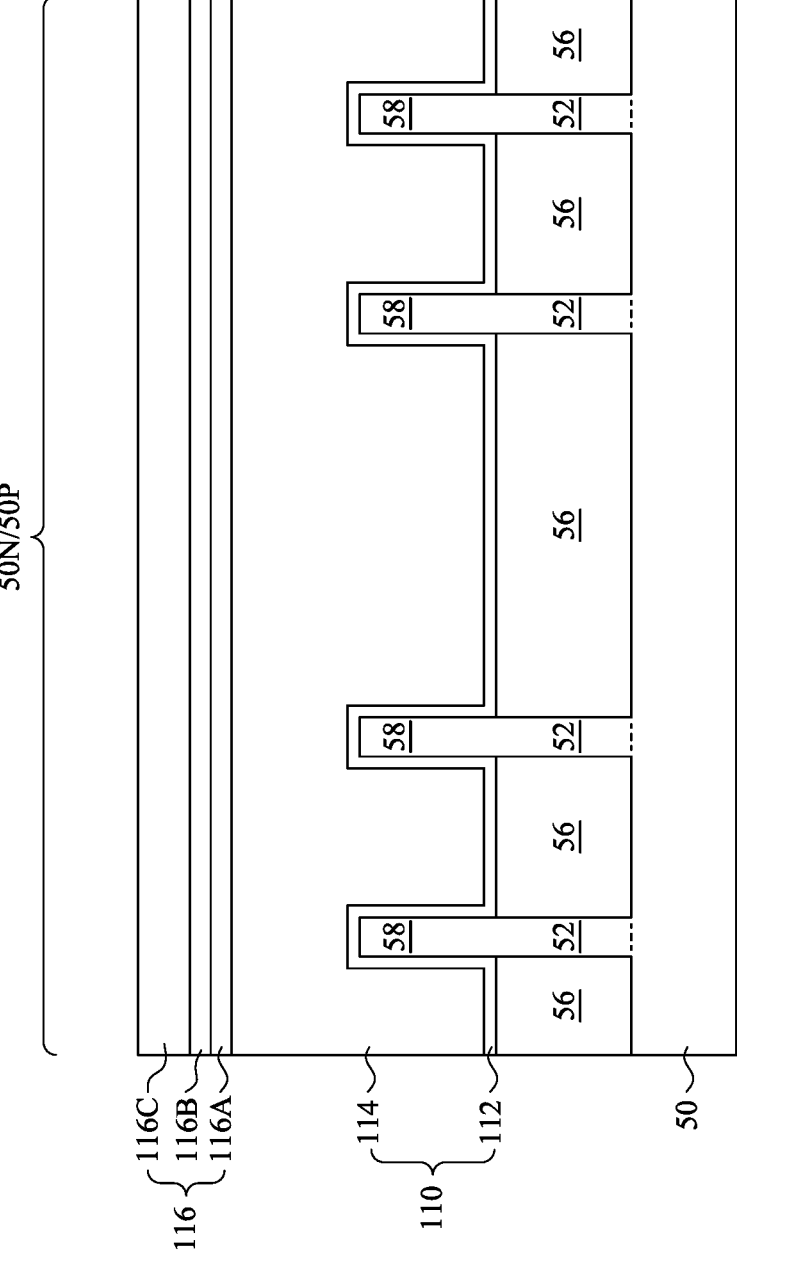

In FIGS. 12A-12B, gate masks 116 are formed over the gate structures 110 (including the gate dielectrics 112 and the gate electrodes 114). In some embodiments, the gate masks 116 may also be formed over the gate spacers 82. Gate contacts will be subsequently formed to penetrate through the gate masks 116 to contact the top surfaces of the gate electrodes 114.

As an example to form the gate masks 116, the gate structures 110 may be recessed using any acceptable etching process. In some embodiments (not separately illustrated), the gate spacers 82 are also recessed. Dielectric material(s) are then conformally deposited in the recesses. The dielectric material(s) may also be deposited on the top surfaces of the first ILD 94, the CESL 92, and the gate spacers 82. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other dielectric materials formed by any acceptable process may be used. A removal process is performed to remove the excess portions of the dielectric material(s), which excess portions are over the top surfaces of the first ILD 94, the CESL 92, and the gate spacers 82, thereby forming the gate masks 116. In some embodiments, a planarization process such as a chemical mechanical polish (CMP), an etch-back process, combinations thereof, or the like is utilized. The dielectric material(s), when planarized, have portions left in the recesses (thus forming the gate masks 116). After the planarization process, the top surfaces of the gate spacers 82, the CESL 92, the first ILD 94, and the gate masks 116 are substantially coplanar (within process variations).

In some embodiments, the gate masks 116 include a first gate mask layer 116A, a second gate mask layer 116B, and a third gate mask layer 116C (not shown in FIG. 12A; see FIG. 12B). The second gate mask layer 116B may be formed of a different material than the first gate mask layer 116A and the third gate mask layer 116C. In some embodiments, the first gate mask layer 116A may be formed of silicon nitride, the second gate mask layer 116B may be formed of silicon, and the third gate mask layer 116C may be formed of silicon nitride. Additionally, the gate mask layers may have different thicknesses. In some embodiments, the third gate mask layer 116C is thicker than the first gate mask layer 116A and the second gate mask layer 116B. Other acceptable quantities, materials, and/or thicknesses of gate mask layers may be utilized.

FIGS. 13A-16C illustrate a process for dividing a gate structure 110 (including a gate dielectric 112 and a gate electrode 114) into multiple gate structures 110 (or gate structure segments). The gate structures 110 of adjacent FinFETs may thus be separately controlled. Dividing a gate structure 110 includes forming a gate isolation structure extending through the gate structure 110, such that the gate isolation structure cuts the gate structure 110 into multiple gate structures 110. The gate isolation structure is formed by patterning an opening in the gate structure 110, forming a dielectric material in the opening, and then expanding the dielectric material. Expanding the dielectric material shrinks (i.e., reduces the width and/or height of) any seams or voids that may be in the gate isolation structure. Shrinking seams/voids in the gate isolation structure can reduce the risk of conductive materials being formed in the seams/voids during subsequent processing, which can help reduce the risk of epitaxial source/drain regions 88 shorting. The reliability of the resulting devices may thus be improved.

Figure 13A:
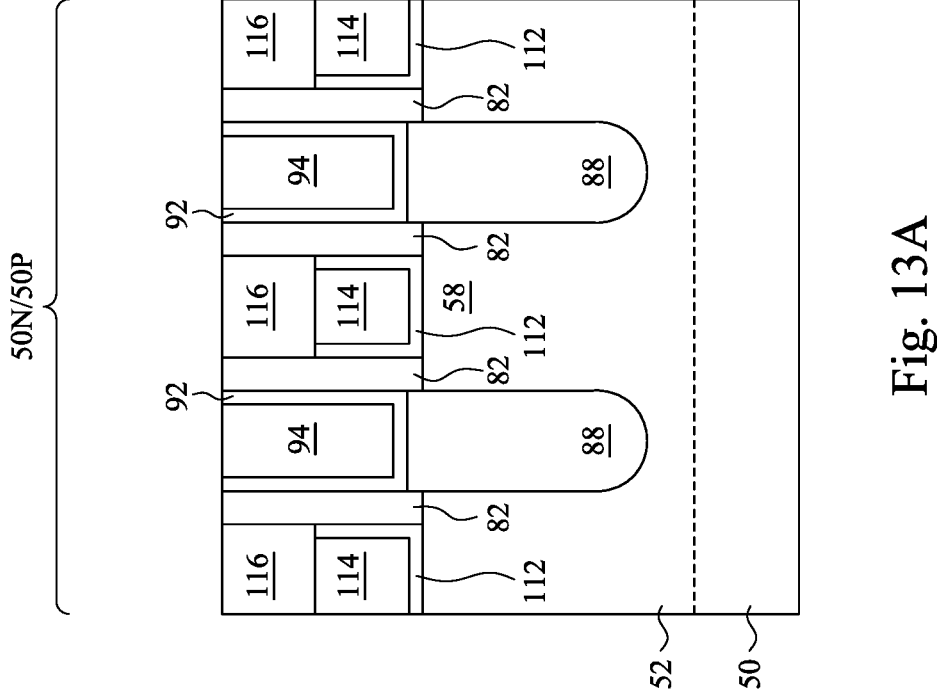
Figure 13B:
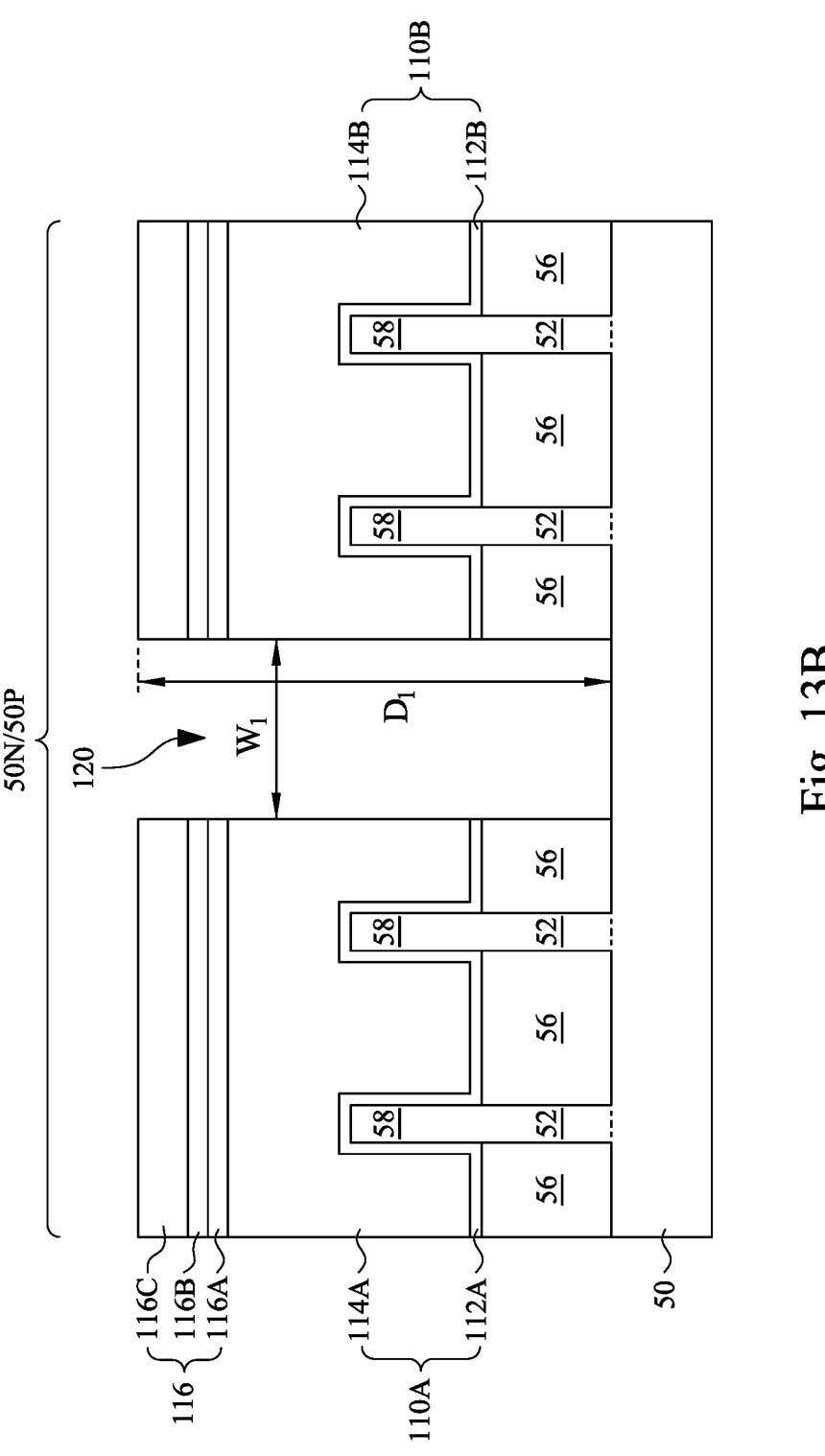
Figure 13C:
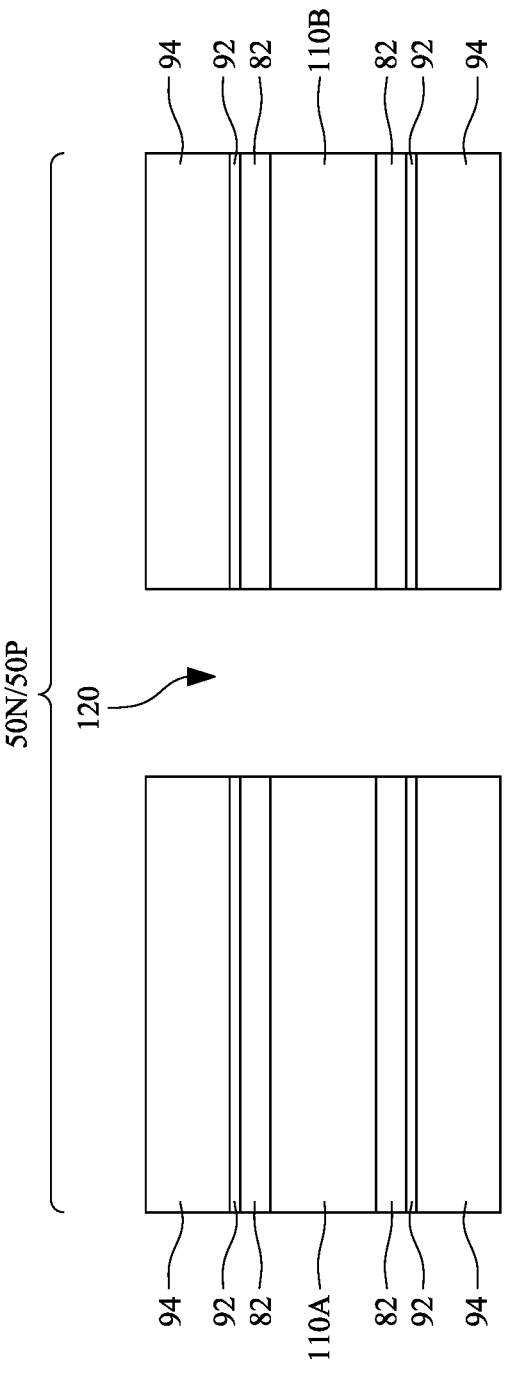

In FIGS. 13A-13C, an opening 120 is formed through a gate mask 116 and a gate structure 110 (including a gate dielectric 112 and a gate electrode 114). The gate structure 110A includes a gate dielectric 112A and a gate electrode 114A, and the gate structure 110B includes a gate dielectric 112B and a gate electrode 114B. The opening 120 may be formed by acceptable photolithography and etching techniques. The etching may be anisotropic. For example, the etch process may be a dry etch such as a RIE, a NBE, or the like. Forming the opening 120 divides the gate structure 110 into multiple gate structures 110 (including a gate structure 110A and a gate structure 110B). The opening 120 may also be wider than the gate structure 110 in a top-down view, such that the opening 120 is formed in the gate spacers 82, the CESL 92, and the first ILD 94, as shown in FIG. 13C.

The opening 120 is formed to a size that is large enough to electrically isolate the gate structure 110A from the gate structure 110B. In some embodiments, the opening 120 has a width $W_1$ between the gate structures 110A, 110B in the range of 10 nm to 30 nm, and has a depth Di in the range of 100 nm to 150 nm. Timed etching processes may be used to stop the etching of the opening 120 after the opening 120 reaches a desired depth. In the illustrated embodiment, the opening 120 extends through the underlying STI region 56 to expose a top surface of the substrate 50. In other embodiments (not separately illustrated): the opening 120 may expose a top surface of the underlying STI region 56 without extending into the underlying STI region 56; the opening 120 may extend into the underlying STI region 56; or the like.

Figure 14A:
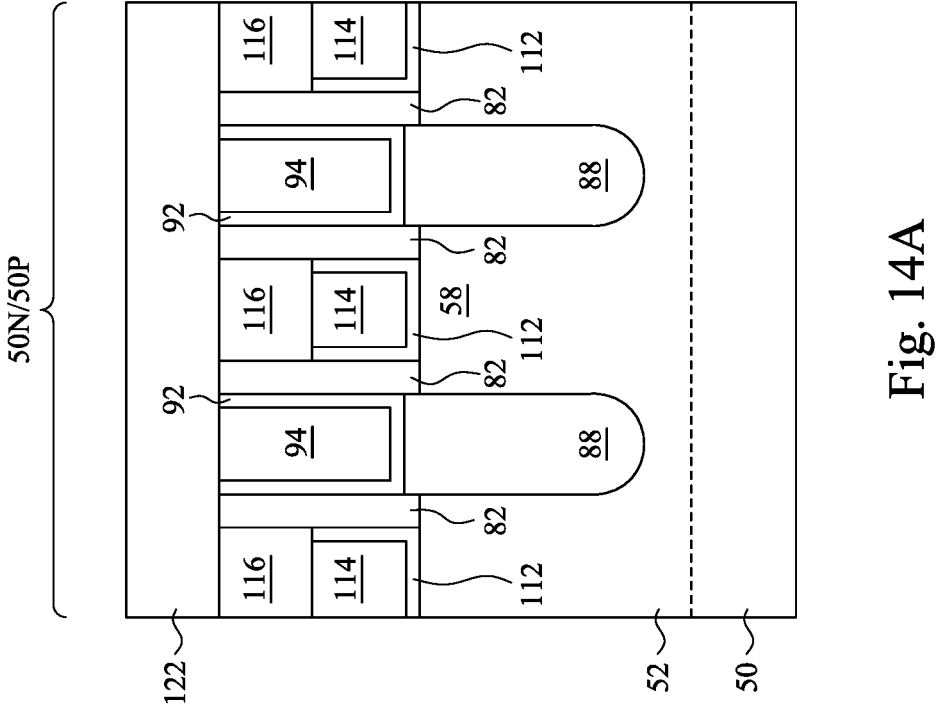
Figure 14B:
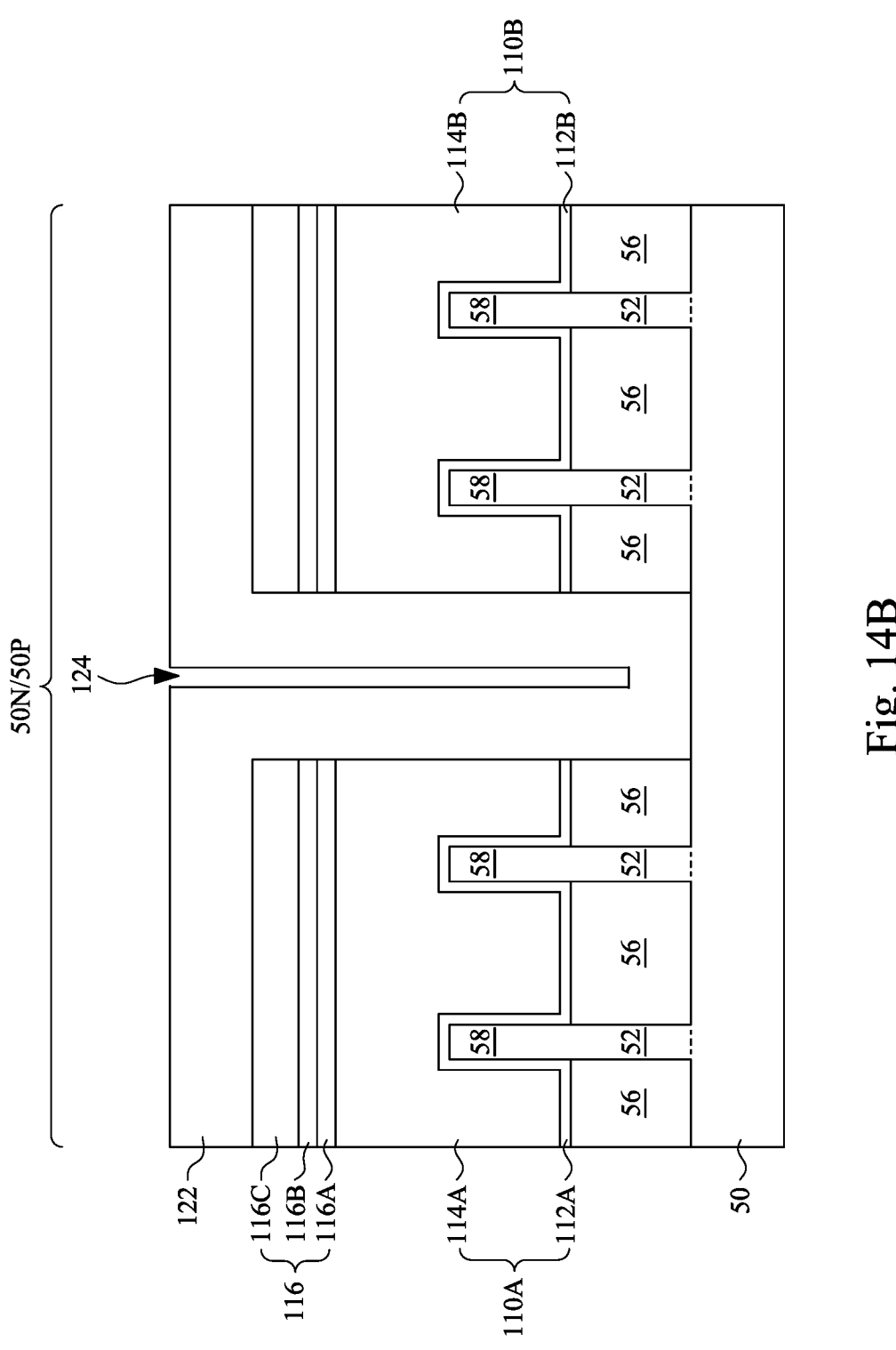
Figure 14C:
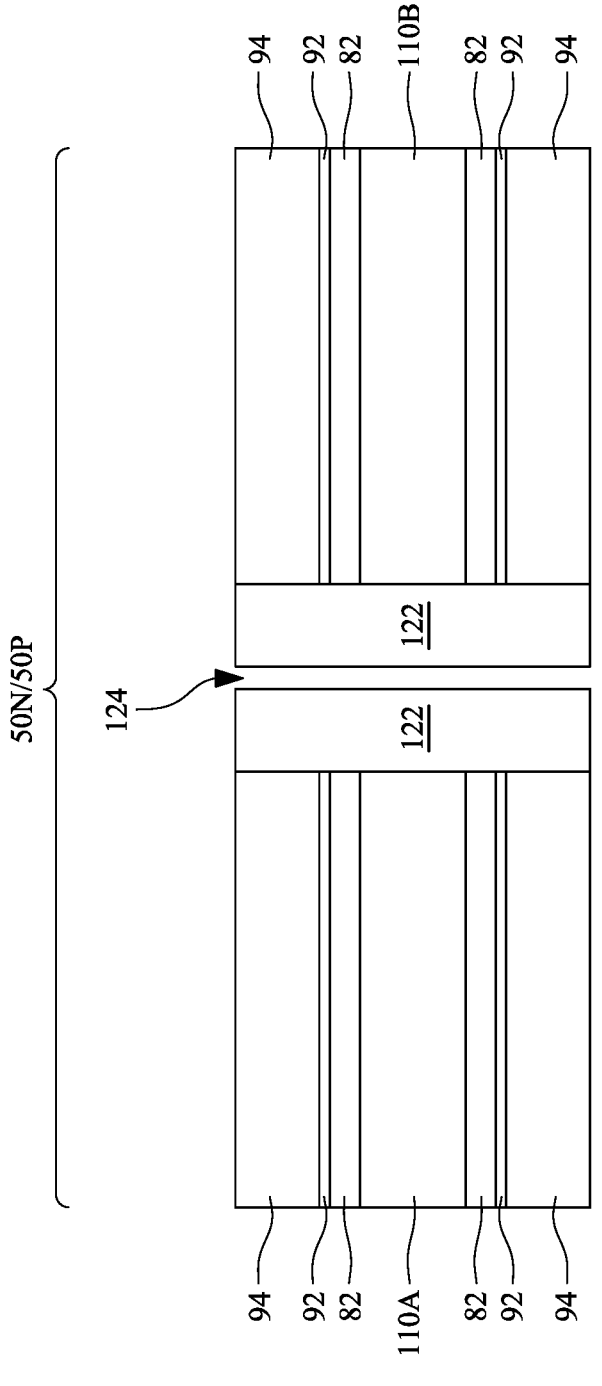

In FIGS. 14A-14C, an isolation layer 122 is formed in the opening 120. The isolation layer 122 may also be formed on the top surfaces of the gate spacers 82, the CESL 92, the first ILD 94, and the gate masks 116. The isolation layer 122 is formed of an expandable dielectric material. An expandable dielectric material is a dielectric material capable of being expanded by a treatment process, such as an annealing process, a plasma treatment process, or the like. Acceptable expandable dielectric materials may include silicon oxycarbonitride, silicon nitride, silicon carbonitride, silicon carbide, silicon oxynitride, silicon oxide, or the like, which may be formed by a conformal deposition process such as atomic layer deposition (ALD), chemical vapor deposition (CVD), or the like. Other expandable dielectric materials formed by any acceptable process may be used.

In some embodiment, the expandable dielectric material is a nitrogen-rich dielectric material, such as nitrogen-rich silicon oxycarbonitride (e.g., $SiO_xC_yN_z$, where x is in the range of 0 to 2, y is in the range of 0 to 1, and z is in the range of 0 to 1.3). The isolation layer 122 is deposited to have a low oxygen concentration. In some embodiments, the isolation layer 122 has an oxygen concentration in the range of 5 at % to 20 at %. The nitrogen-rich silicon oxycarbonitride may be formed by a deposition process such as ALD or CVD. In some embodiments, the nitrogen-rich silicon oxycarbonitride is formed by a ALD process. The ALD process may be performed by cyclically dispensing a silicon source precursor, an oxygen source precursor, a nitrogen source precursor, and a carbon source precursor in the opening 120. Acceptable silicon source precursors for depositing silicon oxycarbonitride include hexachlorodisilane ($Si_2Cl_6$) and the like. Acceptable oxygen source precursors for depositing silicon oxycarbonitride include oxygen gas ($O_2$) and the like. Acceptable nitrogen source precursors for depositing silicon oxycarbonitride include diazene ($H_2N_2$), ammonia ($NH_3$), and the like. Acceptable carbon source precursors for depositing silicon oxycarbonitride include $C_2H_5$, $C_3H_6$, $N(C_2H_5)_3$, and the like. Other acceptable precursors may be used. In some embodiments, the ALD process is performed at a temperature in the range of 400° C. to 650° C., for a duration in the range of 2 hours to 6 hours, and at a pressure in the range of 0.5 Torr to 5 Torr. Depositing the nitrogen-rich dielectric material with processing conditions in these ranges allows the nitrogen-rich dielectric material to be expanded by a desired amount in subsequent processing. Depositing the nitrogen-rich dielectric material with processing conditions outside of these ranges may not allow the nitrogen-rich dielectric material to be expanded by a desired amount in subsequent processing.

The isolation layer 122 is formed to a large enough thickness that a majority of the opening 120 is filled. In some embodiments, the isolation layer 122 is formed to a thickness in the range of 15 nm to 25 nm. After the isolation layer 122 is formed, a seam or void may remain. The seam/void is the portion of the opening 120 unfilled by the isolation layer 122. In the illustrated embodiment, a seam 124 is formed, which is open at a top of the isolation layer 122. In another embodiment (not separately illustrated), a void is formed, which is sealed by pinch-off at a top of the isolation layer 122. The seam 124 may have a width of greater than about 1 nm, such as in the range of 2 nm to 6 nm.

Figure 15A:
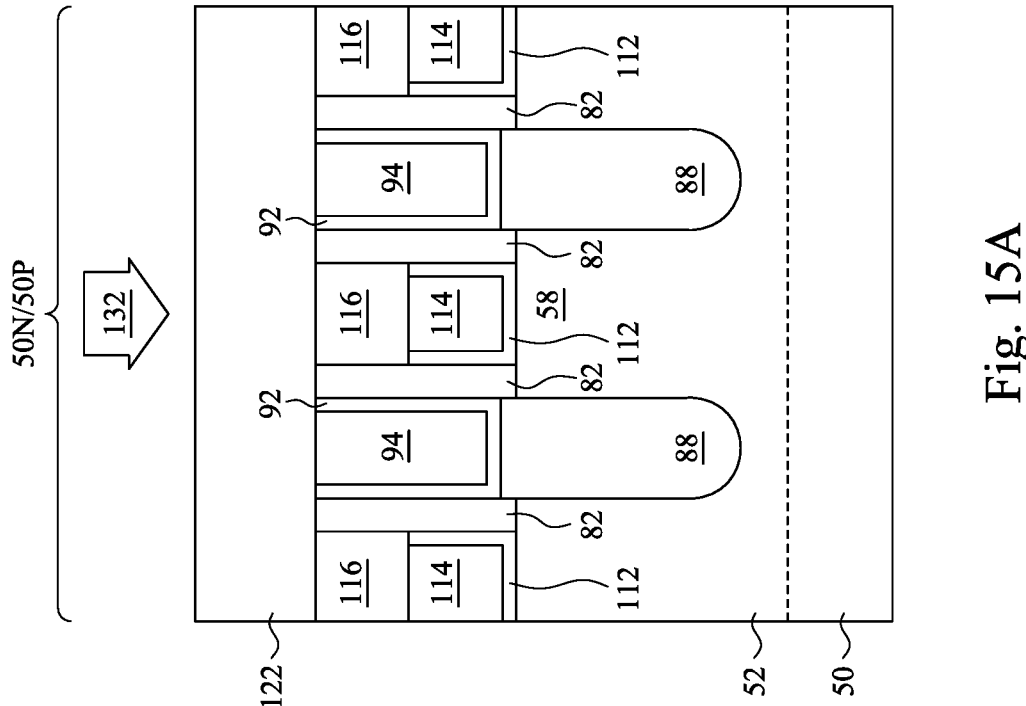
Figure 15B:
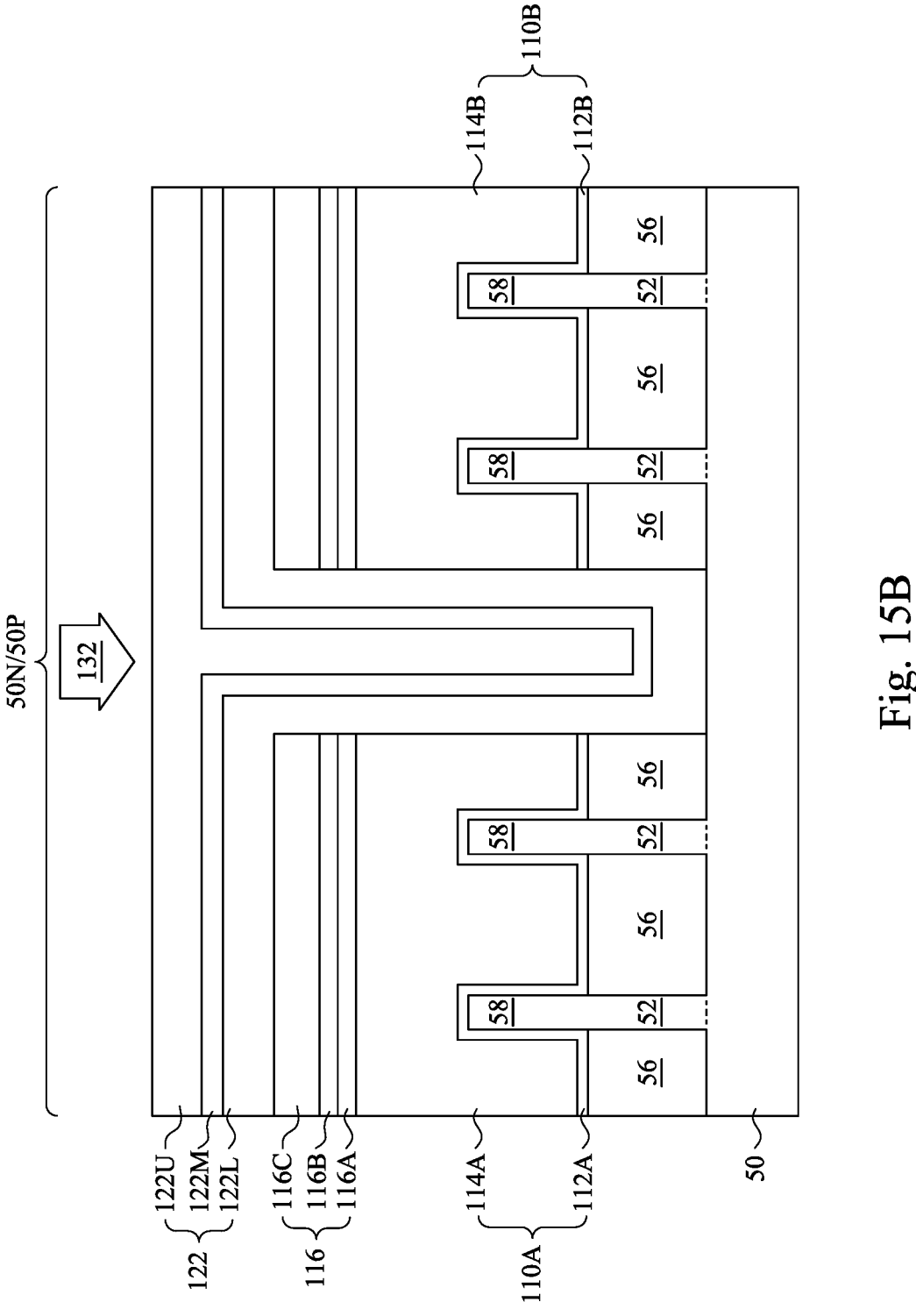
Figure 15C:
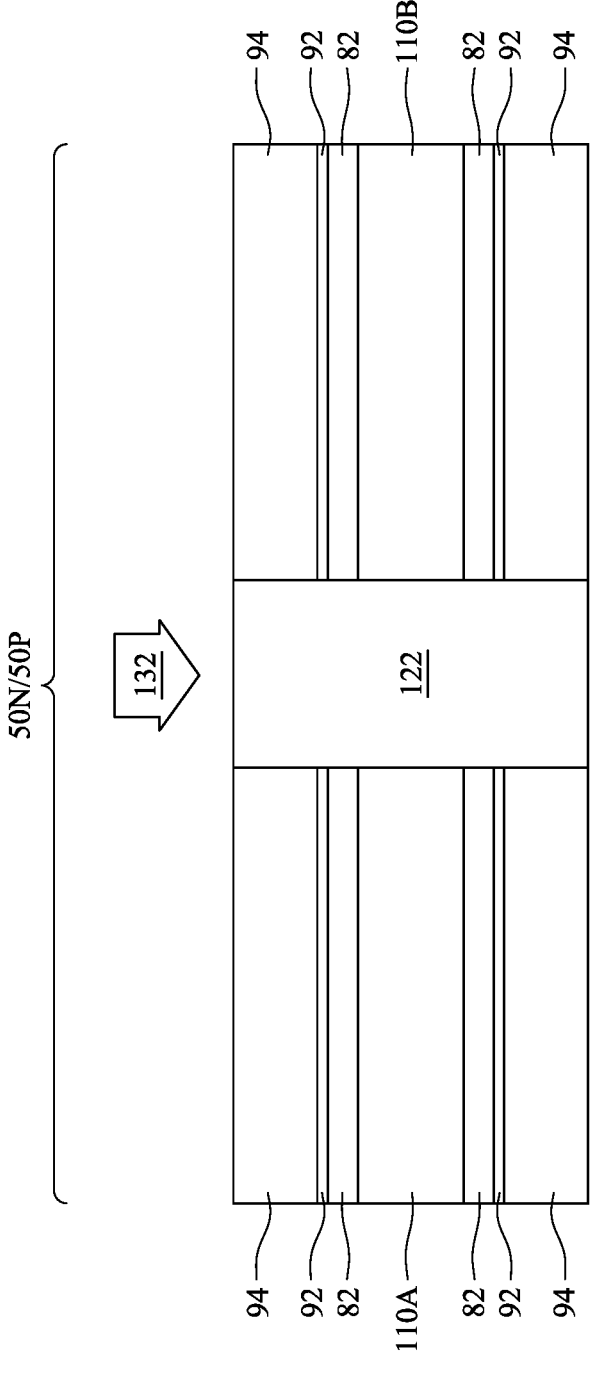

In FIGS. 15A-15C, the isolation layer 122 is expanded to shrink the seam 124 (see FIGS. 14B-14C). Specifically, the dielectric material of the isolation layer 122 is expanded, thereby increasing the volume of the isolation layer 122 and reducing the volume of the seam 124. In the illustrated embodiment, the seam 124 is shrunk until it is eliminated. In another embodiment (not separately illustrated), the seam 124 is shrunk but not eliminated. When the seam 124 remains, it may have a width of less than about 0.3 nm, such as in the range of 0.1 nm to 0.3 nm.

In this embodiment, the isolation layer 122 is expanded by an annealing process 132. The annealing process 132 may be performed in an oxygen-containing environment, such as by annealing the isolation layer 122 while exposing it to an oxygen-containing process gas. The oxygen-containing process gas may include oxygen gas (02) or the like. In some embodiments, the anneal process is a steam anneal, in which the oxygen-containing process gas is steam ($H_2O$) produced by in-situ steam generation (ISSG). Other acceptable oxygen-containing process gases generated by any acceptable technique may also be used. The anneal process drives oxygen from the oxygen-containing process gas into the isolation layer 122, thus oxidizing and expanding the isolation layer 122. In some embodiments, the isolation layer 122 is annealed at a temperature in the range of 350° C. to 600° C., and for a duration in the range of 3 minutes to 6 hours. Performing the annealing process 132 with processing conditions in these ranges allows the isolation layer 122 to be expanded by a desired amount. Performing the annealing process 132 with processing conditions outside of these ranges may not allow the isolation layer 122 to be expanded by a desired amount.

The annealing process 132 converts the expandable dielectric material of the isolation layer 122 to another dielectric material. Specifically, a dielectric material of the isolation layer 122 has an increased oxygen concentration after the annealing process 132. Oxidation of the isolation layer 122 may occur in a directional manner, such that the oxygen concentration of the isolation layer 122 decreases in a direction from the top of the isolation layer 122 to the bottom of the isolation layer 122. In some embodiments, the decrease in oxygen concentration begins at a depth in the range of 10% to 20% from the top of the isolation layer 122.

More specifically, an upper portion of the isolation layer 122U (not shown in FIG. 15A or 15C; see FIG. 15B) comprises a dielectric material with a high oxygen concentration, a middle portion of the isolation layer 122M (not shown in FIG. 15A or 15C; see FIG. 15B) comprises a dielectric material with a moderate oxygen concentration, and a lower portion of the isolation layer 122L (not shown in FIG. 15A or 15C; see FIG. 15B) comprises a dielectric material with a low oxygen concentration, where the low oxygen concentration is less than the high oxygen concentration, and where the moderate oxygen concentration is less than the high oxygen concentration and greater than the low oxygen concentration. In some embodiments, the upper portion of the isolation layer 122U has an oxygen concentration in the range of 10 at % to 40 at %, the middle portion of the isolation layer 122M has an oxygen concentration in the range of 10 at % to 35 at %, and the lower portion of the isolation layer 122L has an oxygen concentration in the range of 10 at % to 20 at %. Accordingly, the upper portion of the isolation layer 122U has a different (e.g., greater) oxygen concentration than the lower portion of the isolation layer 122L. The upper portion of the isolation layer 122U and the lower portion of the isolation layer 122L may have respective oxygen concentrations that are substantially constant (within process variations) throughout, while the middle portion of the isolation layer 122M may have a gradient oxygen concentration that decreases in a direction from the upper portion of the isolation layer 122U to the lower portion of the isolation layer 122L. The portions of the isolation layer 122 may have different thicknesses. The upper portion of the isolation layer 122U may be thinner than the middle portion of the isolation layer 122M, and the middle portion of the isolation layer 122M may be thinner than the lower portion of the isolation layer 122L. In some embodiments, the upper portion of the isolation layer 122U has a thickness in the range of 0 nm to 5 nm, the middle portion of the isolation layer 122M has a thickness in the range of 3 nm to 12 nm, and the lower portion of the isolation layer 122L has a thickness in the range of 10 nm to 20 nm.

Figure 16A:
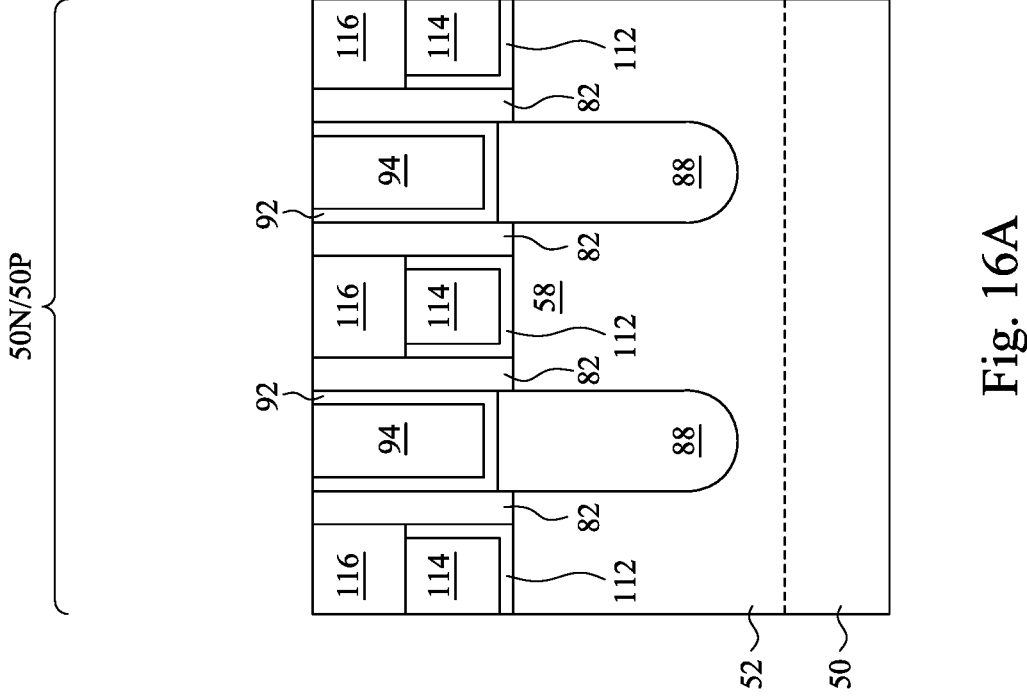
Figure 16B:
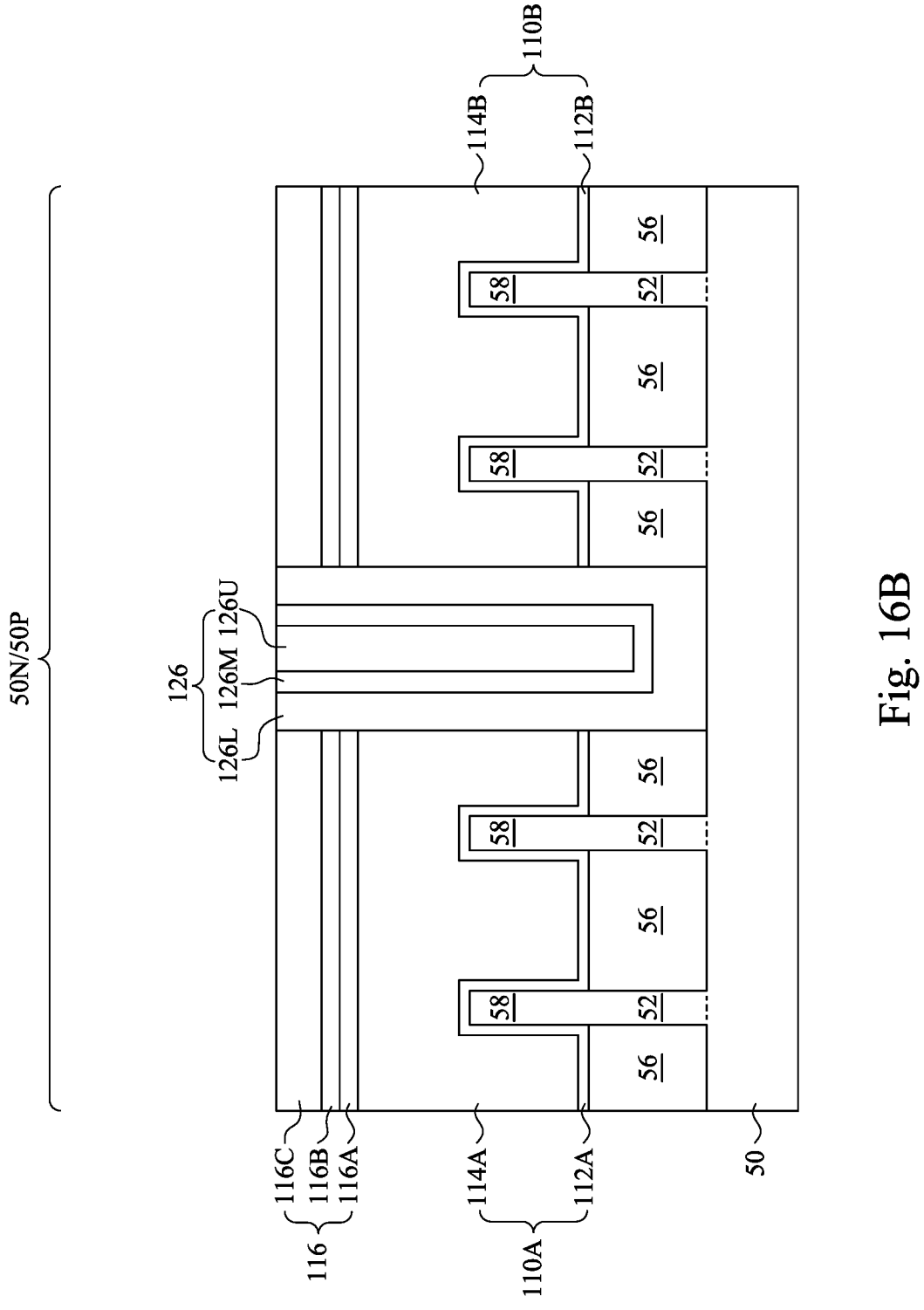
Figure 16C:
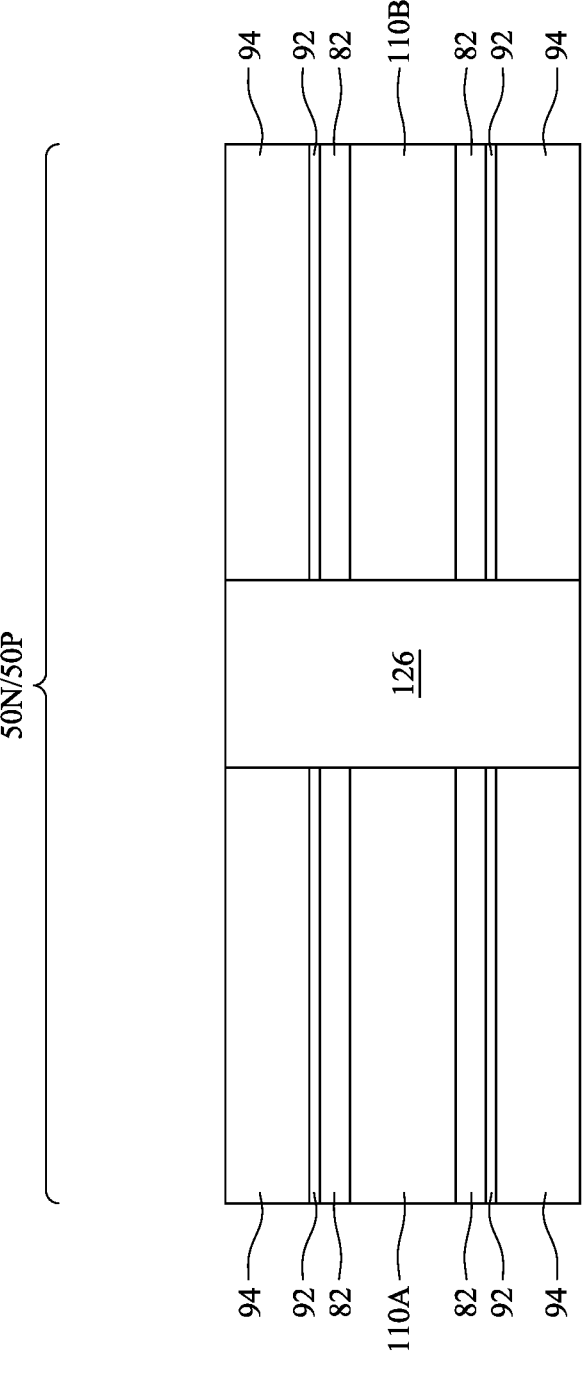

In FIGS. 16A-16C, a removal process is performed to remove the excess portions of the isolation layer 122, which excess portions are over the top surfaces of the gate spacers 82, the CESL 92, the first ILD 94, the gate structures 110, and the gate masks 116, thereby forming a gate isolation structure 126. In some embodiments, a planarization process such as a chemical mechanical polish (CMP), an etch-back process, combinations thereof, or the like is utilized. The isolation layer 122, when planarized, has a portion left in the opening 120 (thus forming the gate isolation structure 126). The top surfaces of the gate spacers 82, the CESL 92, the first ILD 94, the gate masks 116, and the gate isolation structure 126 are substantially coplanar (within process variations). The gate isolation structure 126 is disposed between the gate structure 110A and the gate structure 110B.

The gate isolation structure 126 has portions corresponding to the portions of the isolation layer 122. Specifically, an upper portion of the gate isolation structure 126U includes the remaining upper portion of the isolation layer 122U in the opening 120, a middle portion of the gate isolation structure 126M includes the remaining middle portion of the isolation layer 122M in the opening 120, and a lower portion of the gate isolation structure 126L includes the remaining lower portion of the isolation layer 122L in the opening 120. The top surfaces of the various portions of the gate isolation structure 126U, 126M, 126L are substantially coplanar (within process variations). The lower portion of the gate isolation structure 126L is U-shaped, such that it extends continuously along a sidewall of the gate structure 110A, beneath the upper portion of the gate isolation structure 126U, and along a sidewall of the gate structure 110B. Accordingly, the lower portion of the gate isolation structure 126L is disposed between the upper portion of the gate isolation structure 126U and each of the gate structures 110A, 110B.

A single gate isolation structure 126 is described for FIGS. 13A-16C. It should be appreciated that multiple gate isolation structures 126 may be formed. The multiple gate isolation structures 126 may be formed in a gate structure 110 to divide the gate structure 110 into more than two gate structures 110. Additionally, the gate isolation structure 126 described for FIGS. 13A-16C divides a single gate structure 110. It should be appreciated that a gate isolation structure 126 may extend across adjacent gate structures 110 in a top-down view. As such, a single gate isolation structure 126 may divide multiple gate structures 110.

In the embodiment where the opening 120 extends into/ through the underlying STI region 56 (see FIG. 13B), the gate isolation structure 126 also extends into/through the underlying STI region 56. A bottommost point of the gate isolation structure 126 is closer in distance to the primary surface of the substrate 50 than a bottommost point of the gate structure 110A and a bottommost point of the gate structure 110B. The bottommost point of the gate isolation structure 126 and an uppermost point of the underlying STI region 56 lie on different horizontal planes. The gate isolation structure 126 may contact the substrate 50.

Figure 17A:
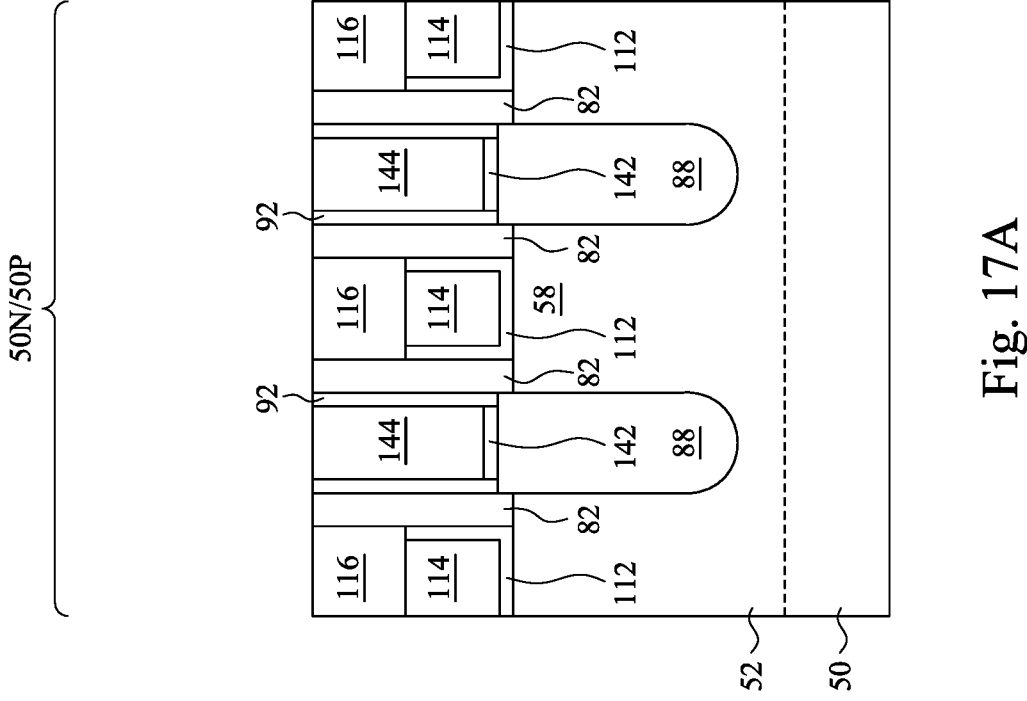
Figure 17B:
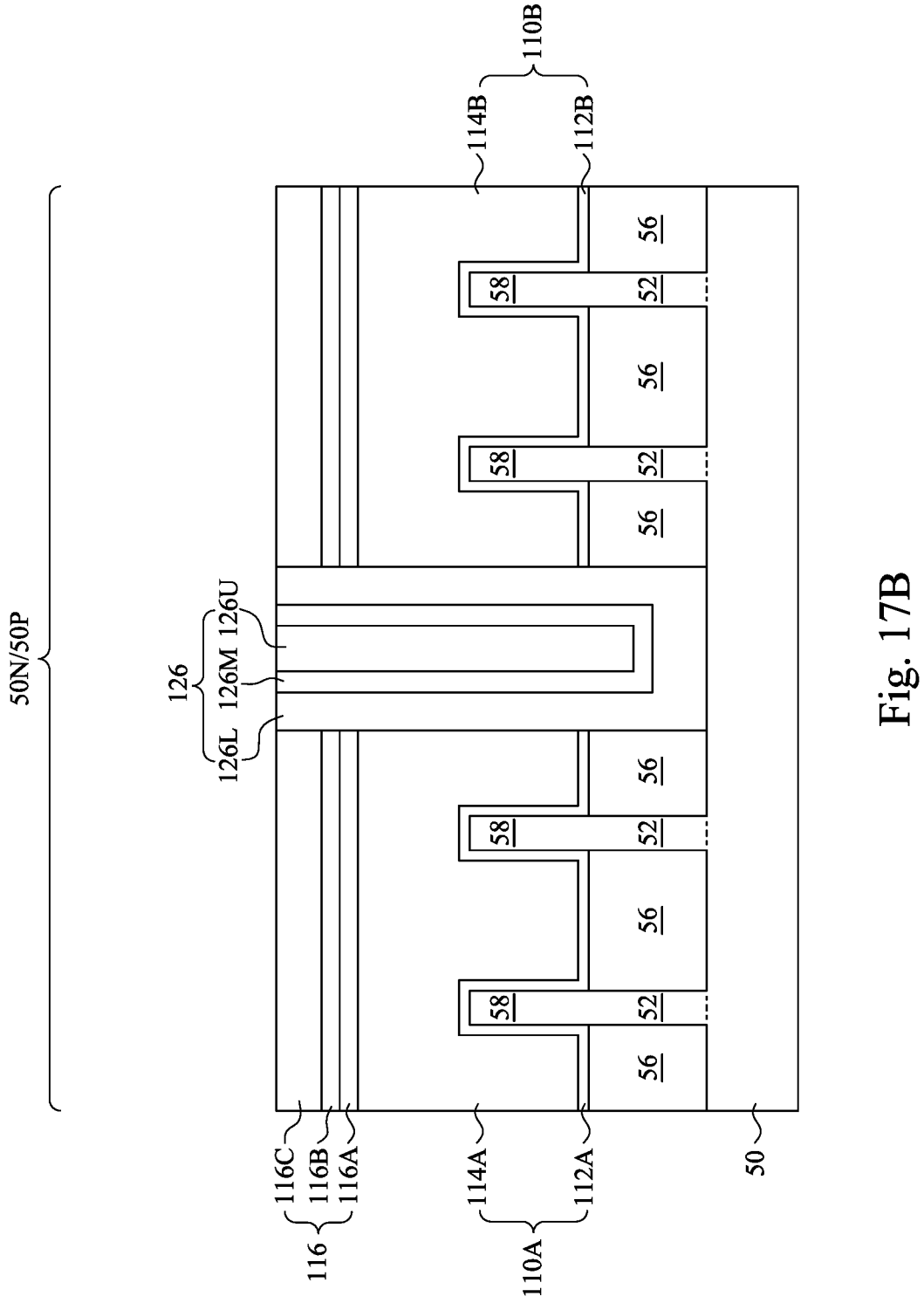
Figure 17C:
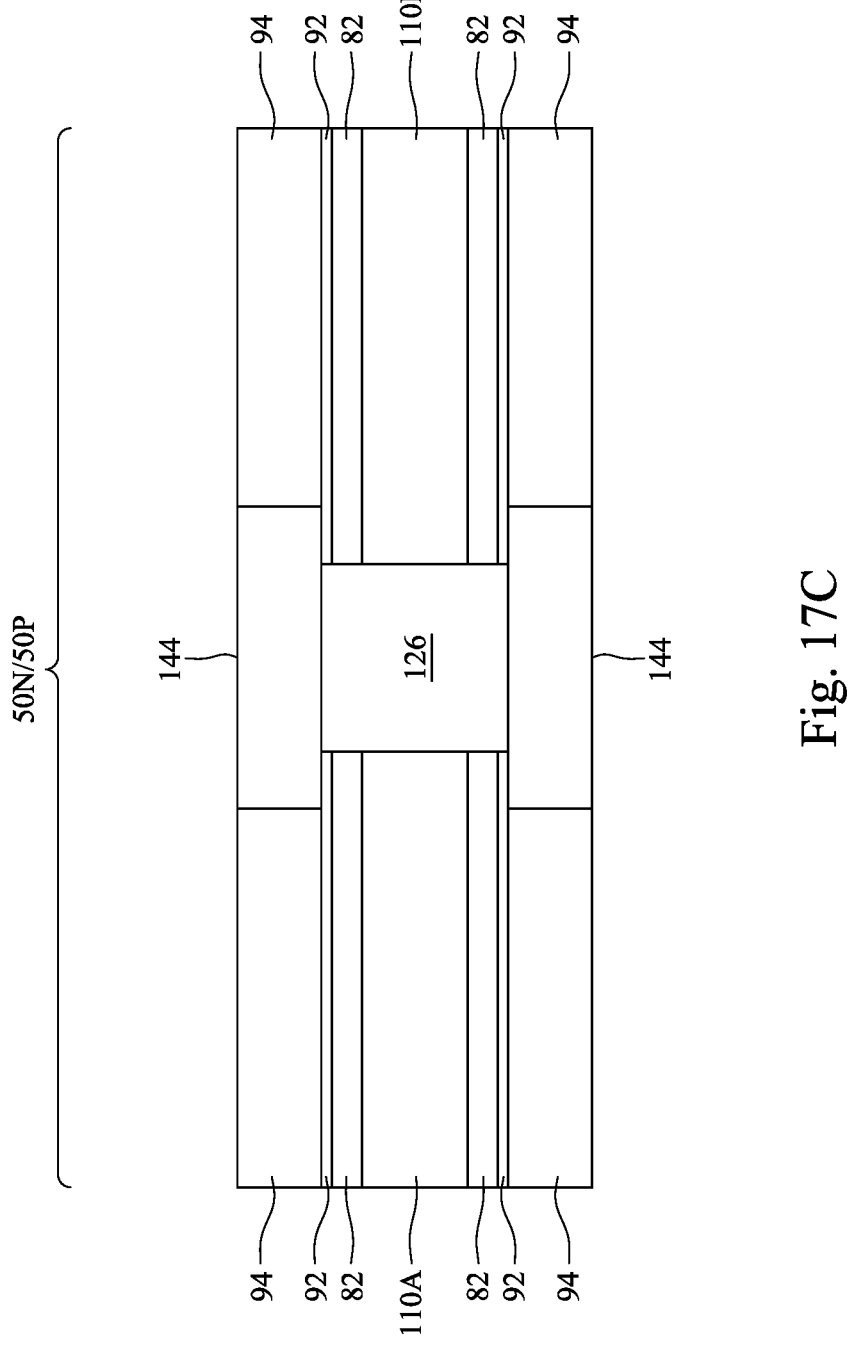

In FIGS. 17A-17C, source/drain contacts 144 are formed for the epitaxial source/drain regions 88. As an example to form the source/drain contacts 144, openings are formed through the CESL 92, the first ILD 94, and the gate isolation structure 126. The openings may be formed using acceptable photolithography and etching techniques. In the illustrated embodiment, the openings are formed by a self-aligned contact (SAC) process. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A removal process may be performed to remove excess material from the top surfaces of the gate spacers 82, the CESL 92, the first ILD 94, the gate masks 116, and the gate isolation structure 126. The remaining liner and conductive material form the source/drain contacts 144 in the openings. In some embodiments, a planarization process such as a chemical mechanical polish (CMP), an etch-back process, combinations thereof, or the like is utilized. After the planarization process, the top surfaces of the gate spacers 82, the CESL 92, the first ILD 94, the gate masks 116, the gate isolation structure 126, and the source/drain contacts 144 are substantially coplanar (within process variations). The source/drain contacts 144 may be physically and electrically coupled to the epitaxial source/drain regions 88.

Optionally, metal-semiconductor alloy regions 142 are formed at the interfaces between the epitaxial source/drain regions 88 and the source/drain contacts 144. The metal-semiconductor alloy regions 142 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 142 can be formed before the material(s) of the source/drain contacts 144 by depositing a metal in the openings for the source/ drain contacts 144 and then performing a thermal anneal process. The metal can be any metal capable of reacting with the semiconductor materials (e.g., silicon, silicon-germanium, germanium, etc.) of the epitaxial source/drain regions 88 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 142. The material(s) of the source/drain contacts 144 can then be formed on the metal-semiconductor alloy regions 142.

Figure 18A:
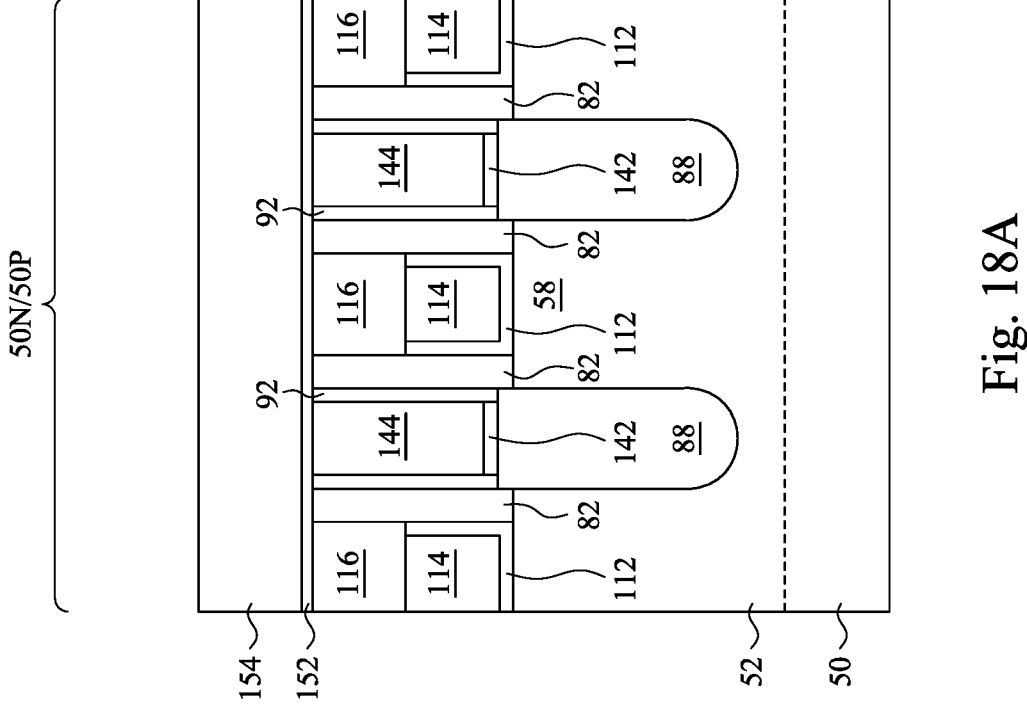
Figure 18B:
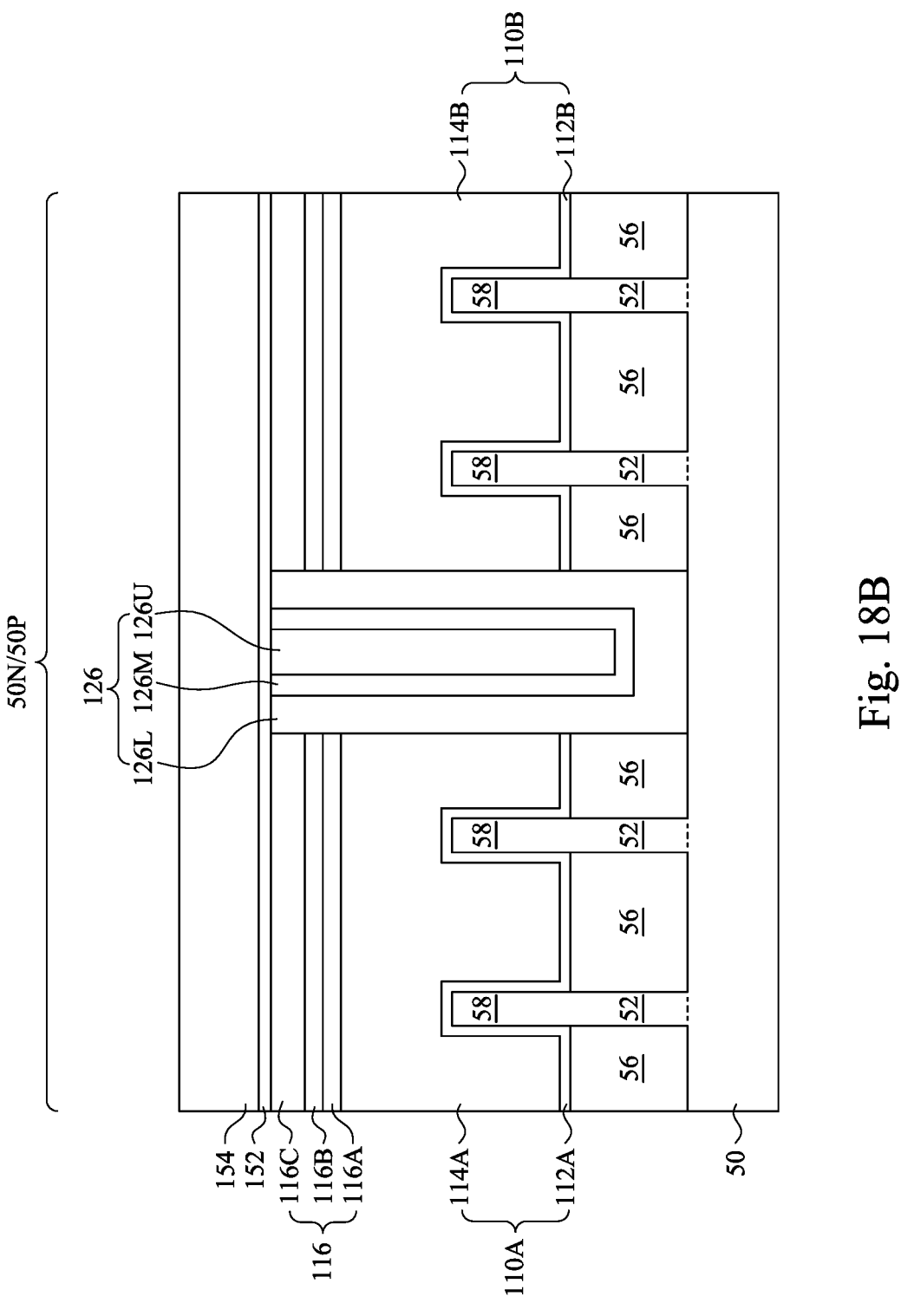
Figure 18C:
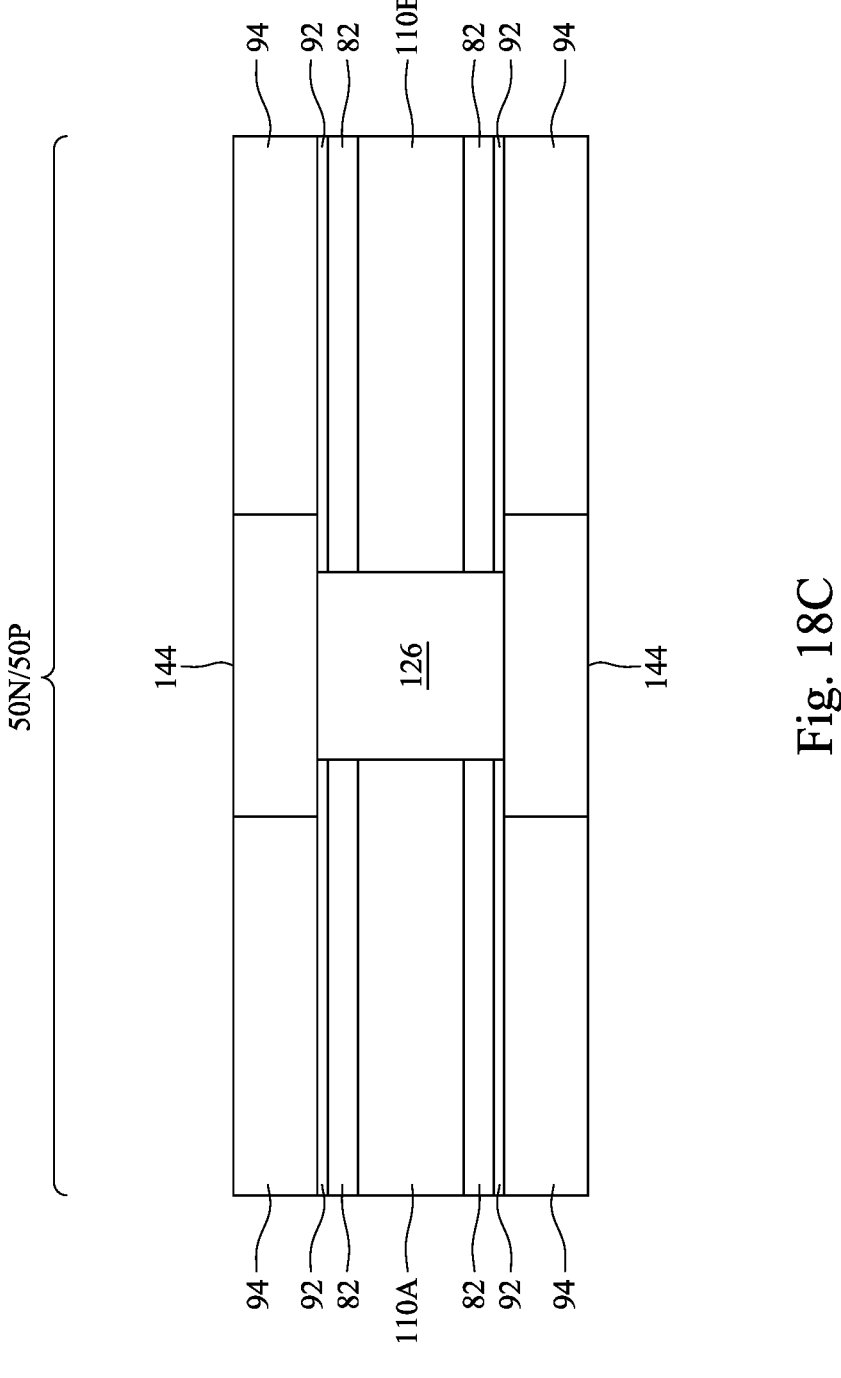

In FIGS. 18A-18C, a second ILD 154 is deposited over the gate spacers 82, the CESL 92, the first ILD 94, the gate masks 116, and the source/drain contacts 144. In some embodiments, the second ILD 154 is a flowable film formed by a flowable CVD method. In some embodiments, the second ILD 154 is formed of a dielectric material such as PSG, BSG, BPSG, USG, or the like, which may be deposited by any suitable method, such as CVD, PECVD, or the like.

In some embodiments, an etch stop layer (ESL) 152 is formed between the second ILD 154 and the gate spacers 82, the CESL 92, the first ILD 94, the gate masks 116, and the source/drain contacts 144. The ESL 152 may include a dielectric material having a high etching selectivity from the etching of the second ILD 154, such as, silicon nitride, silicon oxide, silicon oxynitride, or the like.

Figure 19A:
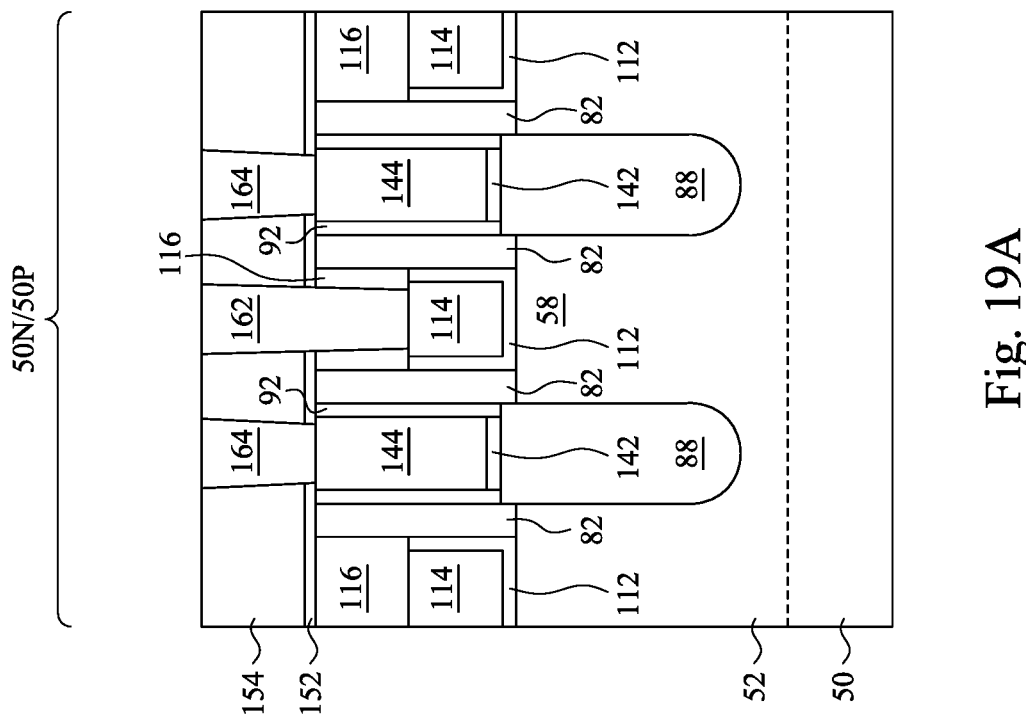
Figure 19B:
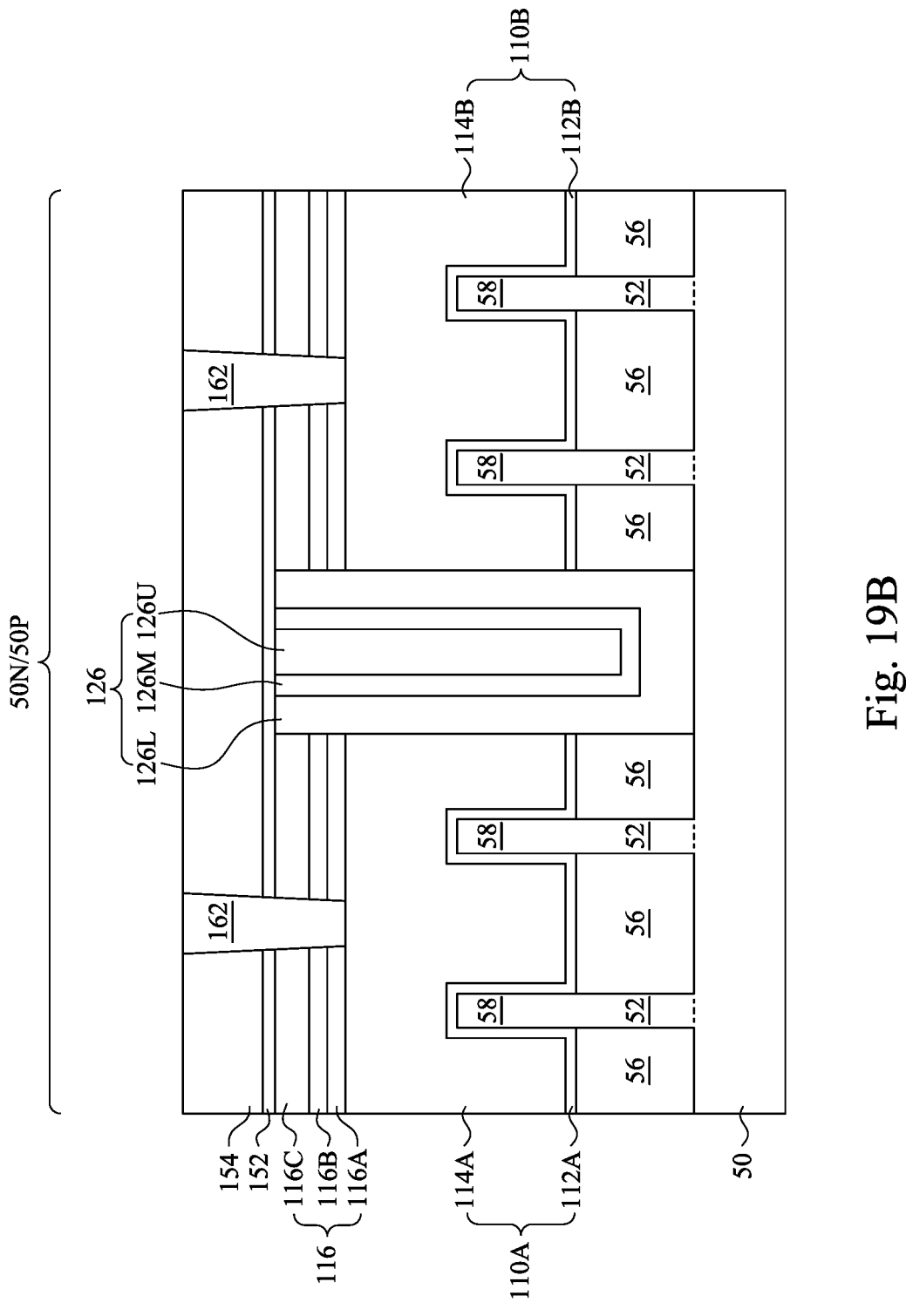
Figure 19C:
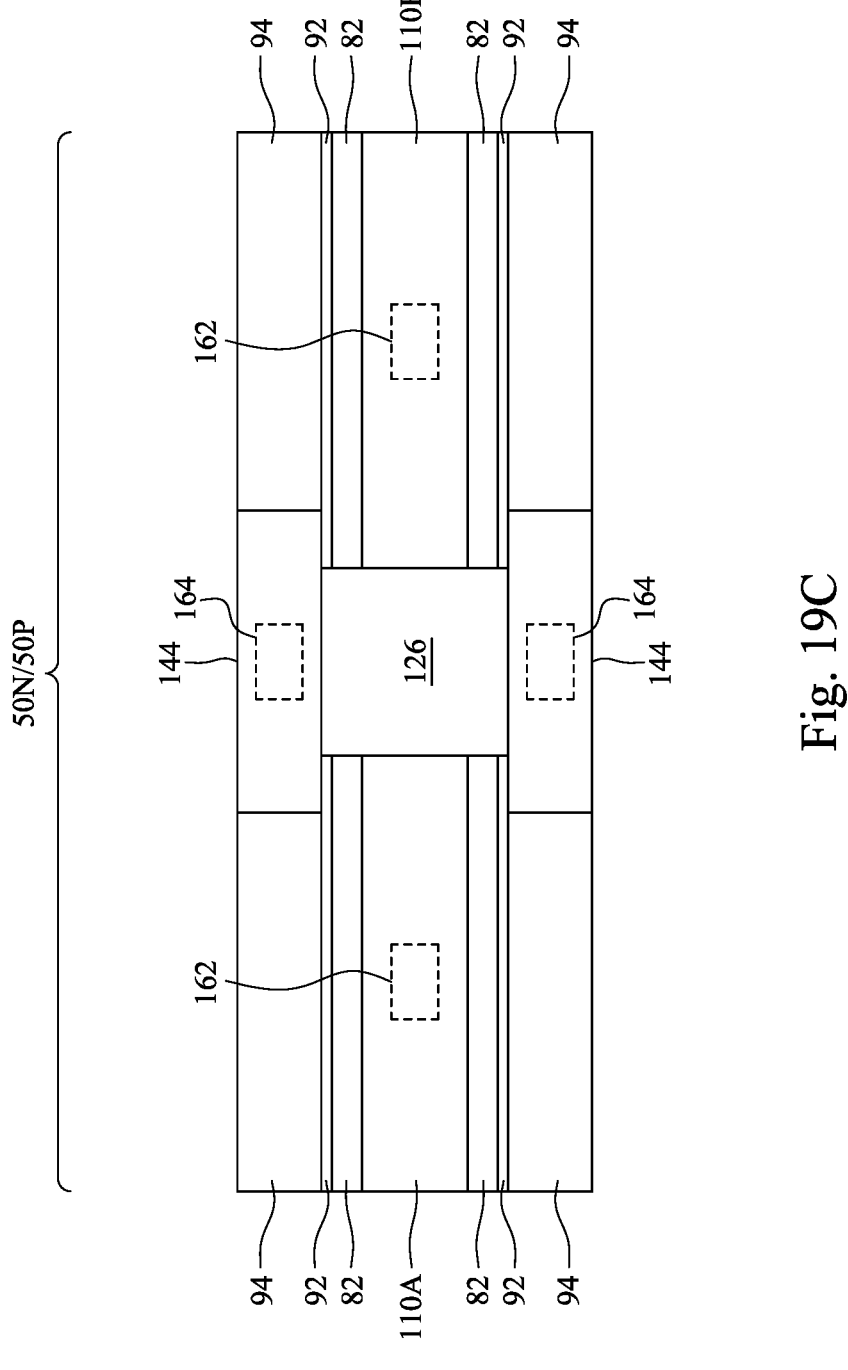

In FIGS. 19A-19C, gate contacts 162 and source/drain vias 164 are formed to contact, respectively, the gate electrodes 114 and the source/drain contacts 144. The gate contacts 162 are physically and electrically coupled to the gate electrodes 114. The source/drain vias 164 are physically and electrically coupled to the source/drain contacts 144.

As an example to form the gate contacts 162 and the source/drain vias 164, openings for the gate contacts 162 are formed through the second ILD 154, the ESL 152, and the gate masks 116, and openings for the source/drain vias 164 are formed through the second ILD 154 and the ESL 152. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the second ILD 154. The remaining liner and conductive material form the gate contacts 162 and the source/drain vias 164 in the openings. The gate contacts 162 and the source/drain vias 164 may be formed in distinct processes, or may be formed in the same process. Although shown as being formed in the same cross-section in FIG. 19A, it should be appreciated that each of the gate contacts 162 and the source/drain vias 164 may be formed in different cross-sections, as shown in FIG. 19C, which may avoid shorting of the contacts.

Figure 20:
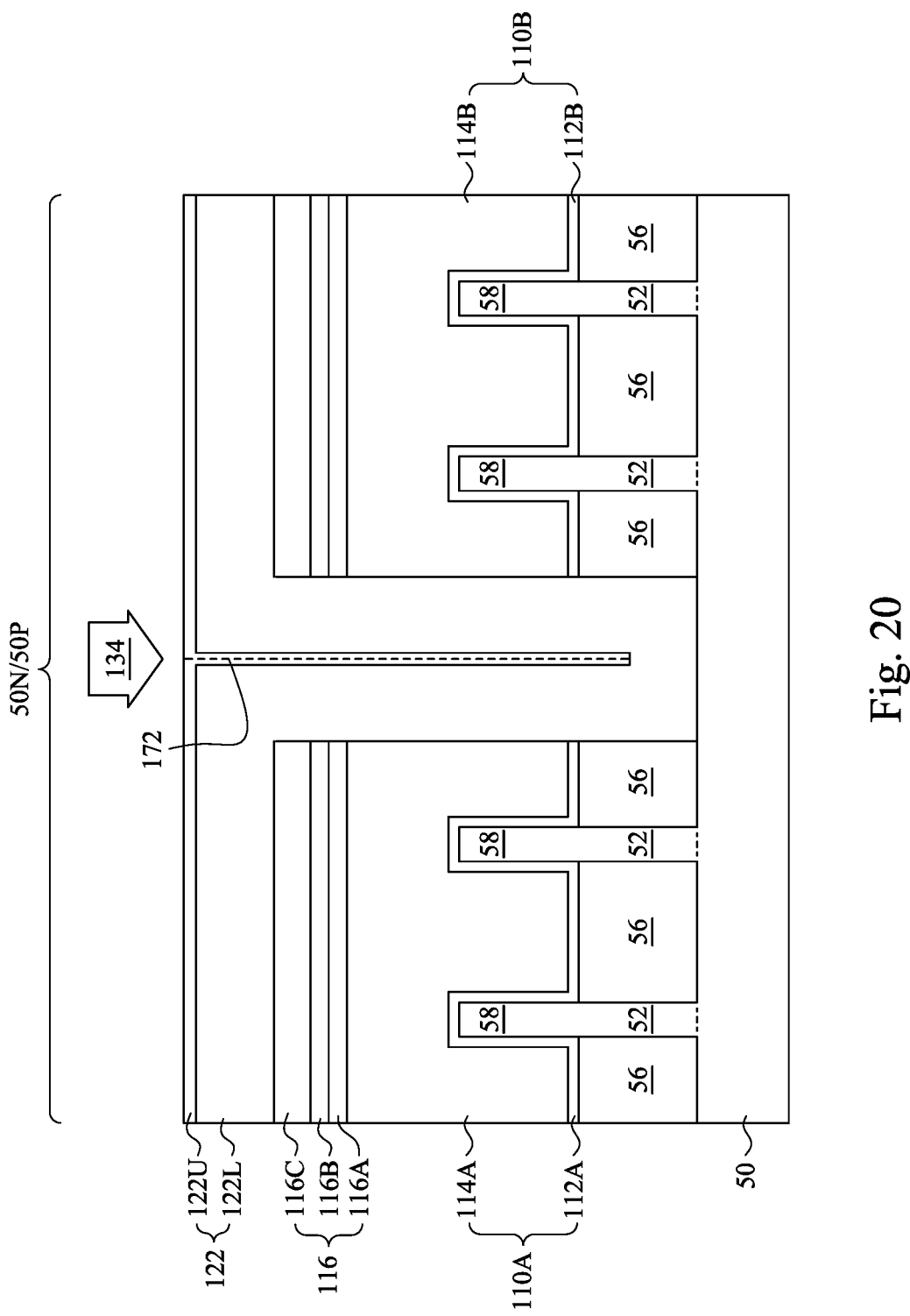
FIGS. 20-21 are views of intermediate stages in the manufacturing of FinFETs, in accordance with some other embodiments.
Figure 21:
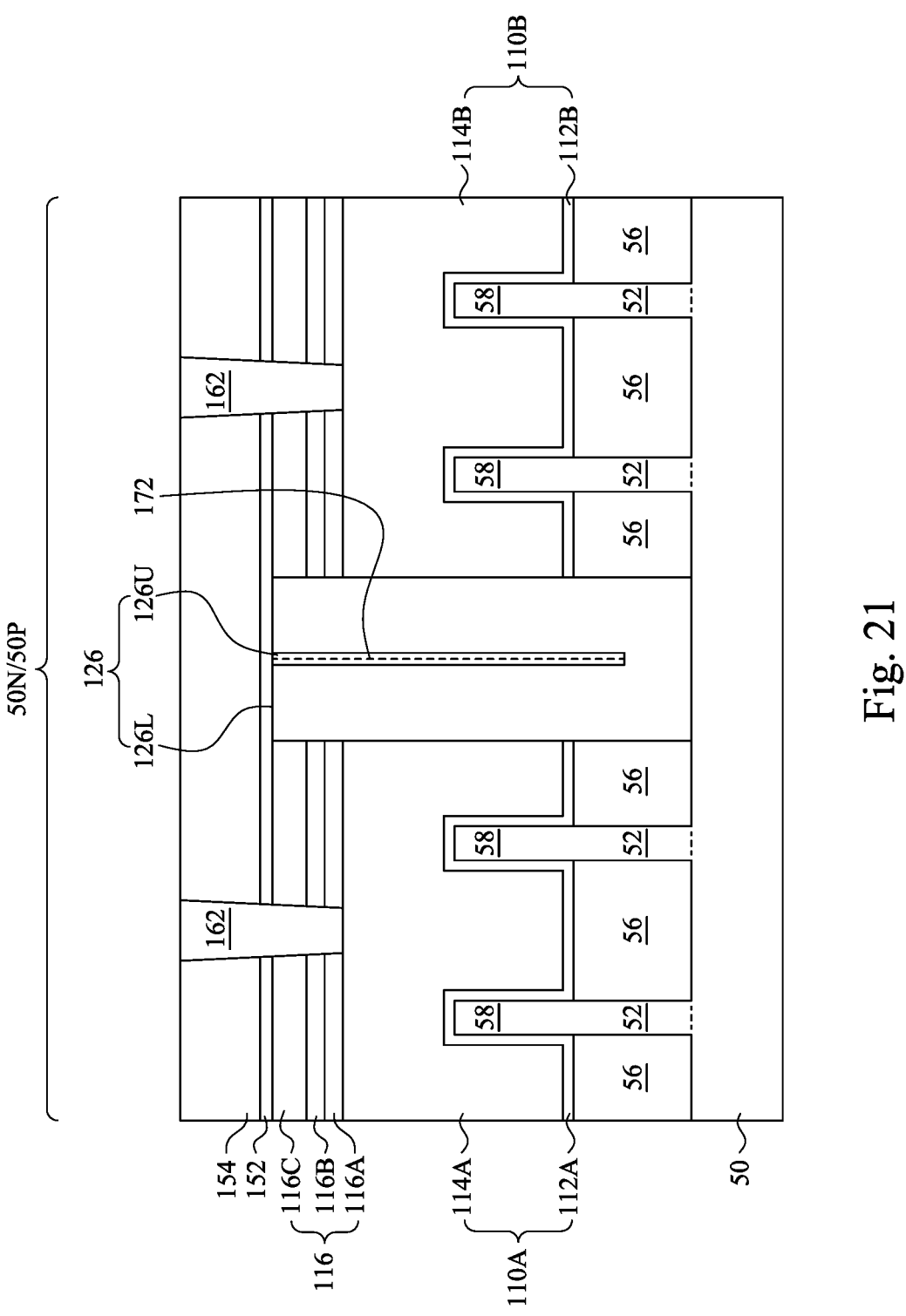

FIGS. 20-21 are views of intermediate stages in the manufacturing of FinFETs, in accordance with some other embodiments. A similar process as described for FIGS. 2-19C is performed, except the step described for FIG. 20 is performed in lieu of the step described for FIGS. 15A-15C, thereby obtaining the structure of FIG. 21. FIGS. 20 and 21 are cross-sectional views illustrated along a similar cross-section as reference cross-section B-B' in FIG. 1.

In FIG. 20, appropriate steps as described above are performed to form the structure of FIGS. 14A-14C. Then, the isolation layer 122 is expanded to shrink the seam 124 (see FIGS. 14B-14C). In this embodiment, the isolation layer 122 is expanded by a plasma treatment process 134. The plasma treatment process 134 may be performed by bombarding the isolation layer 122 with ions in a chamber. The ions are ions of an element that induces cross-linking (a "cross-linking element") of the material of the isolation layer 122. Specifically, cross-linking of the material of the isolation layer 122 occurs in the portions of the isolation layer 122 that define the sidewalls of the seam 124 (see FIGS. 14B-14C). The cross-linking chemically bonds the portions of the isolation layer 122 at the sidewalls of the seam 124 to one another at an interface 172, thereby drawing them together to expand the isolation layer 122. The isolation layer 122 can be bombarded with ions by flowing a gas source into the chamber, and using a plasma generator to excite the gas source into a plasma state. The gas source includes a source precursor for ions of the cross-linking element. Radio frequency (RF) power is applied by the plasma generator to the isolation layer 122 to activate the ion source gas to a plasma state and bombard the isolation layer 122 with ionized gas molecules from the plasma. The plasma generation power may be pulsed between a low power and a high power during the plasma treatment process 134. In some embodiments, the isolation layer 122 is bombarded with ions for a duration in the range of 3 minutes to 30 minutes. As will be subsequently described in greater detail, additional plasma treatment process(es) may be performed before the plasma treatment process 134.

In some embodiments, the cross-linking element is oxygen. The gas source for plasma generation thus includes an oxygen source precursor such as oxygen gas ($O_2$). Oxygen radicals may be generated during generation of the plasma. The oxygen radicals bond to atoms, such as silicon atoms, in the isolation layer 122 at the sidewalls of the seam 124. For example, a first silicon atom at a first sidewall of the seam 124 and a second silicon atom at an opposing second sidewall of the seam 124 may each bond to an oxygen radical, thereby forming an Si—O—Si bond across the interface 172. The Si—O—Si bonds pull the sidewalls of the seam 124 towards each other, thereby expanding the isolation layer 122 and shrinking the seam 124.

In some embodiments, the cross-linking element is nitrogen. The gas source for plasma generation thus includes a nitrogen source precursor such as ammonia ($NH_3$) or the like. The nitrogen bonds to atoms, such as silicon atoms, in the isolation layer 122 at the sidewalls of the seam 124. For example, a first silicon atom at a first sidewall of the seam 124 and a second silicon atom at an opposing second sidewall of the seam 124 may each bond to a nitrogen ion, thereby forming an Si—N—Si bond across the interface 172. The Si—N—Si bonds pull the sidewalls of the seam 124 towards each other, thereby expanding the isolation layer 122 and shrinking the seam 124.

In some embodiments, a combination of cross-linking elements, such as oxygen and nitrogen, is utilized. The gas source for plasma generation thus includes both an oxygen source precursor and a nitrogen source precursor. Both Si—O—Si and Si—N—Si bonds are formed, which pull the sidewalls of the seam 124 towards each other, thereby expanding the isolation layer 122 and shrinking the seam 124.

A first pre-treatment process may be performed to shrink the material of the isolation layer 122. Shrinking the isolation layer 122 before the plasma treatment process 134 may open any voids that formed as a result of pinch-off at a top of the isolation layer 122. The resulting seams (e.g., opened voids) may then be treated by the plasma treatment process 134 to shrink the seams. The first pre-treatment process may also be a plasma process, similar to that previously described, except a different gas source is used. The gas source includes an inhibitor such as nitrogen gas ($N_2$) or the like.

A second pre-treatment process may be performed to clean surface impurities from the isolation layer 122, which can increase the amount of bonds formed by cross-linking during the plasma treatment process 134. The impurities may include fluorine impurities, chlorine impurities, hydrogen impurities, and the like. The second pre-treatment process may also be a plasma process, similar to that previously described, except a different gas source is used. The gas source includes a hydrogen source precursor such as hydrogen gas ($H_2$) or the like. Hydrogen radicals may be generated during generation of the plasma. The hydrogen radicals bond to the impurities, thereby producing a gas such as hydrogen fluoride (HF), hydrogen chloride (HCl), hydrogen ($H_2$), and the like, which may be purged from the chamber.

The plasma treatment process 134 converts the dielectric material of the isolation layer 122 to another dielectric material. Specifically, a dielectric material of the isolation layer 122 has an increased concentration of the cross-linking element(s). When the cross-linking element(s) include oxygen, the isolation layer 122 has an increased oxygen concentration. When the cross-linking element(s) include nitrogen, the isolation layer 122 has an increased nitrogen concentration. Modification of the isolation layer 122 may occur in a directional manner, such that the concentration of the cross-linking element(s) in the isolation layer 122 decreases in a direction from the top of the isolation layer 122 to the bottom of the isolation layer 122.

More specifically, an upper portion of the isolation layer 122U has an increased concentration of the cross-linking element(s), while a lower portion of the isolation layer 122L does not have an increased concentration of the cross-linking element(s). In some embodiments, the upper portion of the isolation layer 122U has a concentration of the cross-linking element(s) in the range of 20 at % to 40 at %, and the lower portion of the isolation layer 122L has a concentration of the cross-linking element(s) of 0 at %. The portions of the isolation layer 122 may have different thicknesses. The upper portion of the isolation layer 122U may be thinner than the lower portion of the isolation layer 122L. In some embodiments, the upper portion of the isolation layer 122U has a thickness in the range of 3 nm to 5 nm and the lower portion of the isolation layer 122L has a thickness in the range of 10 nm to 20 nm.

In FIG. 21, appropriate steps as described above are performed to complete formation of the devices. The gate isolation structure 126 has portions corresponding to the portions of the isolation layer 122. Specifically, an upper portion of the gate isolation structure 126U includes the remaining upper portion of the isolation layer 122U in the opening 120, and a lower portion of the gate isolation structure 126L includes the remaining lower portion of the isolation layer 122L in the opening 120. The top surfaces of the various portions 126U, 126L of the gate isolation structure 126 are substantially coplanar (within process variations). The sidewalls of the upper portion of the gate isolation structure 126U are bonded to each other along the interface 172 by the previously described cross-linking. The resulting devices have a similar top-down view as FIG. 19C, except the gate isolation structure 126 includes the interface 172.

Embodiments may achieve advantages. Referring to FIG. 19C, the gate isolation structure 126 is disposed between the source/drain contacts 144 at opposite sides of the gate structures 110A, 110B. Specifically, the gate isolation structure 126 is between the gate structures 110A, 110B in a first cross-section, and the gate isolation structure 126 is between the source/drain contacts 144 in a second cross-section that is perpendicular to the first cross-section. As noted above, expanding the dielectric material of the gate isolation structure 126 shrinks a seam 124 (see FIG. 14C) in the gate isolation structure 126. Shrinking the seam 124 reduces the risk of a conductive material being formed in the seam 124 during the formation of the source/drain contacts 144. The risk of forming a leakage path between the source/drain contacts 144 at opposite sides of the gate structures 110A, 110B may thus be reduced, which can help reduce the risk of the corresponding epitaxial source/drain regions 88 shorting. The reliability of the resulting devices may thus be improved.

In the previous embodiments, the dielectric material of the isolation layer 122 is treated to shrink any seams or voids that have been previously formed in the isolation layer 122. Alternatively or additionally, a treatment process may be utilized during formation of the dielectric material of the isolation layer 122. This treatment process prevents (or at least reduces the risk of) the formation of seams or voids in the dielectric material before the seams/voids are formed, instead of shrinking the seams/voids after they are formed.

Figure 22:
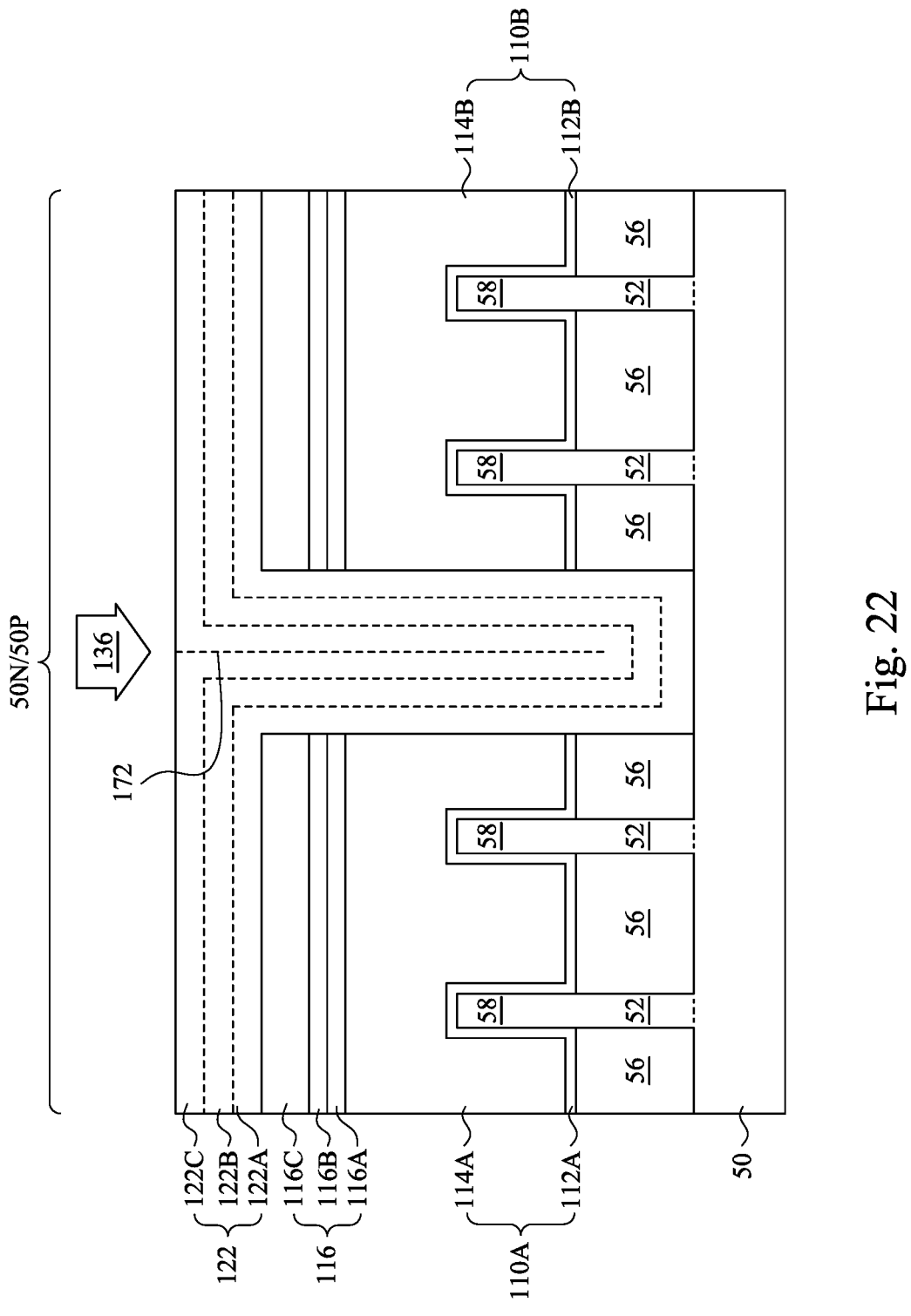
FIGS. 22-23 are views of intermediate stages in the manufacturing of FinFETs, in accordance with some other embodiments.
Figure 23:
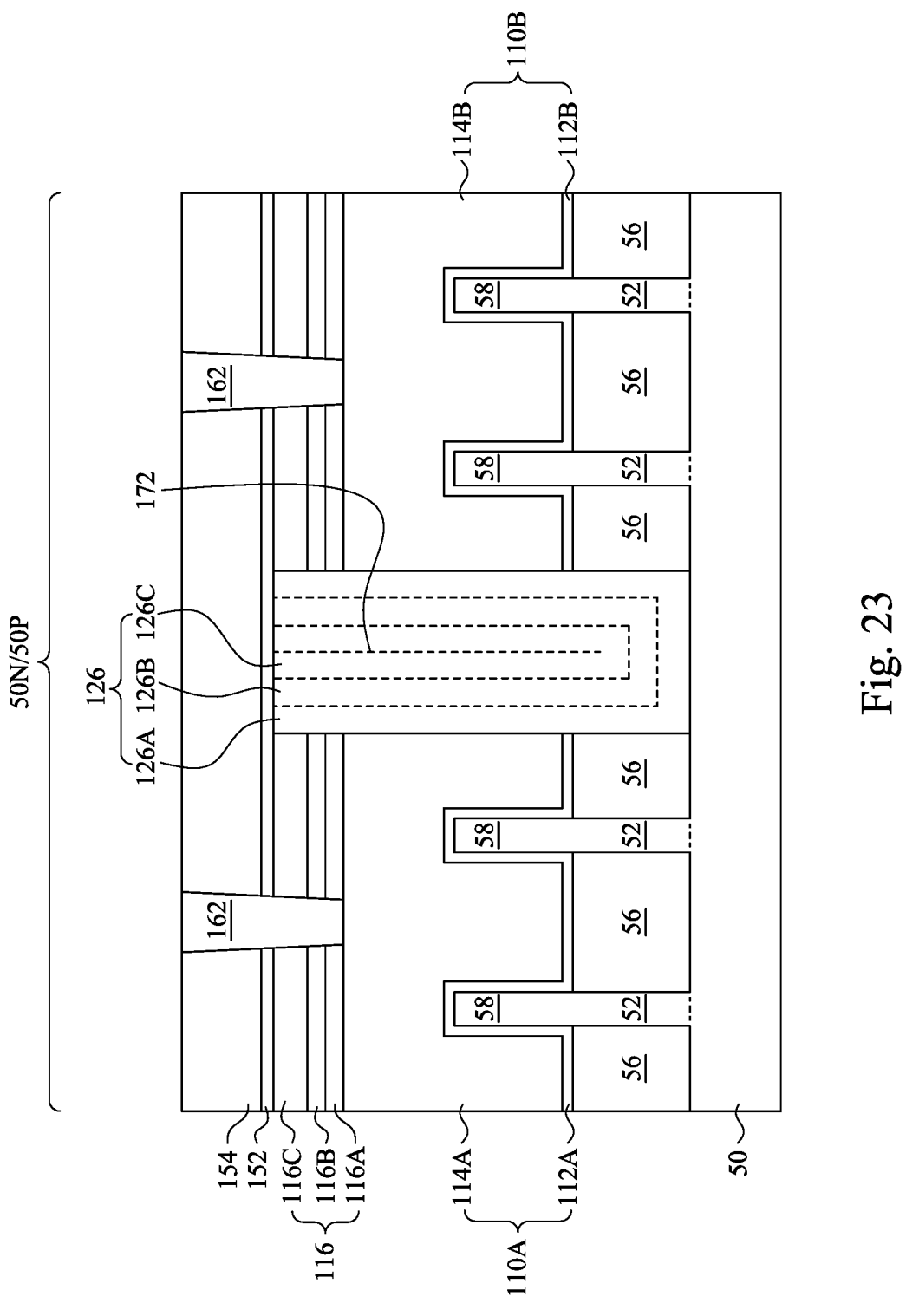

FIGS. 22-23 are views of intermediate stages in the manufacturing of FinFETs, in accordance with some other embodiments. A similar process as described for FIGS. 2-19C is performed, except the step described for FIG. 22 is performed in lieu of the steps described for FIGS. 14A-14C and 15A-15C, thereby obtaining the structure of FIG. 23. FIGS. 22 and 23 are cross-sectional views illustrated along a similar cross-section as reference cross-section B-B' in FIG. 1.

In FIG. 22, appropriate steps as described above are performed to form the structure of FIGS. 13A-13C. Then, the isolation layer 122 is formed in the opening 120. In this embodiment, the isolation layer 122 includes a plurality of dielectric layers (such as dielectric layers 122A, 122B, 122C), and a surface treatment process 136 is performed between the deposition of each dielectric layer. The surface treatment process 136 modifies the treated surface(s). Specifically, the surface treatment process 136 increases a quantity of reactions sites (e.g., nucleation sites) for depositing a subsequent dielectric layer. For example, after depositing the dielectric layer 122A, a surface treatment process 136 is performed on the dielectric layer 122A, where the surface treatment process 136 increases a quantity of reaction sites for depositing the dielectric layer 122B on the dielectric layer 122A. Increasing the quantity of reaction sites increases the conformality of the subsequent deposition process. Performing a plurality of surface treatment processes 136 when depositing the dielectric layers 122A, 122B, 122C may allow the isolation layer 122 to be formed without seams or voids, or at least may allow any seams/voids to be formed with a decreased size.

The surface treatment process 136 may be performed by bombarding the underlying dielectric layer with ions in a chamber. The ions are ions of an element that bond to the underlying dielectric layer and form reactions sites for a subsequent deposition process. For example, the ions may be hydrogen ions, nitrogen ions, and/or oxygen ions, which bond with silicon atoms of the underlying dielectric layer to create open Si—H, Si—N—H, and/or Si—O—H bonds for silicon atoms to bond with in the subsequent deposition process. The underlying dielectric layer can be bombarded with ions by flowing a gas source into the chamber, and using a plasma generator to excite the gas source into a plasma state. The gas source includes a source precursor for ions of the desired element, such as hydrogen gas ($H_2$), ammonia ($NH_3$), nitrogen gas ($N_2$), or oxygen gas (02). Radio frequency (RF) power is applied by the plasma generator to the underlying dielectric layer to activate the ion source gas to a plasma state and bombard the underlying dielectric layer with ionized gas molecules from the plasma. The plasma generation power may be pulsed between a low power and a high power during the surface treatment process 136.

In the illustrated embodiment, the isolation layer 122 includes three dielectric layers 122A, 122B, 122C. Another quantity of dielectric layers may be utilized. A deposition/treatment cycle may be performed any desired quantity of time to deposit the desired quantity of dielectric layers for the isolation layer 122. In some embodiments, each cycle includes depositing a dielectric layer for a duration in the range of 1 second to 5 seconds and performing a surface treatment process for a duration in the range of 10 seconds to 30 seconds.

In FIG. 23, appropriate steps as described above are performed to complete formation of the devices. The gate isolation structure 126 has portions corresponding to the dielectric layers of the isolation layer 122. Specifically, a dielectric layer of the gate isolation structure 126A includes the remaining dielectric layer 122A in the opening 120, a dielectric layer of the gate isolation structure 126B includes the remaining dielectric layer 122B in the opening 120, and a dielectric layer of the gate isolation structure 126C includes the remaining dielectric layer 122C in the opening 120. The resulting devices have a similar top-down view as FIG. 19C, except the gate isolation structure 126 includes the interface 172.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

Further, the FinFET/NSFET devices may be interconnected by metallization layers in an overlying interconnect structure to form integrated circuits. The overlying interconnect structure can be formed in a back end of line (BEOL) process, in which the metallization layers are connected to the gate contacts 162 and the source/drain vias 164. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

In an embodiment, a device includes: an isolation region; a first gate structure on the isolation region; a second gate structure on the isolation region; and a gate isolation structure between the first gate structure and the second gate structure in a first cross-section, an upper portion of the gate isolation structure having a first concentration of an element, a lower portion of the gate isolation structure having a second concentration of the element, the first concentration different from the second concentration, the lower portion extending continuously along a sidewall of the first gate structure, beneath the upper portion, and along a sidewall of the second gate structure. In some embodiments, the device further includes: a first source/drain contact; and a second source/drain contact, the gate isolation structure disposed between the first source/drain contact and the second source/drain contact in a second cross-section. In some embodiments of the device, a top surface of the gate isolation structure is substantially coplanar with a top surface of the first source/drain contact and a top surface of the second source/drain contact. In some embodiments of the device, a first sidewall of the gate isolation structure is bonded to a second sidewall of the gate isolation structure at an interface of the first sidewall and the second sidewall. In some embodiments of the device, the upper portion has a first thickness, the lower portion has a second thickness, and the second thickness is greater than the first thickness. In some embodiments of the device, the element is oxygen. In some embodiments of the device, the element is nitrogen. In some embodiments of the device, a portion of the gate isolation structure extends into the isolation region.

In an embodiment, a device includes: a first fin extending above a surface of a semiconductor substrate; a second fin extending above the surface of the semiconductor substrate; a fin isolation structure between the first fin and the second fin; a first gate structure on the fin isolation structure and the first fin; a second gate structure on the fin isolation structure and the second fin; and a gate isolation structure between the first gate structure and the second gate structure, a bottommost point of the gate isolation structure closer in distance to the surface than a bottommost point of the first gate structure and a bottommost point of the second gate structure, the bottommost point of the gate isolation structure and an uppermost point of the fin isolation structure lying on different horizontal planes, an upper portion of the gate isolation structure having a greater oxygen concentration than a lower portion of the gate isolation structure, the lower portion disposed between the upper portion and the first gate structure, the lower portion disposed between the upper portion and the second gate structure. In some embodiments of the device, a middle portion of the gate isolation structure has greater oxygen concentration than the lower portion and a lesser concentration of oxygen than the upper portion. In some embodiments of the device, the upper portion is thinner than the middle portion, and the middle portion is thinner than the lower portion. In some embodiments of the device, a first sidewall of the gate isolation structure is bonded to a second sidewall of the gate isolation structure by Si—O—Si bonds at an interface of the first sidewall and the second sidewall. In some embodiments, the device further includes: a first gate mask on the first gate structure; and a second gate mask on the second gate structure, a top surface of the gate isolation structure substantially coplanar with a top surface of the first gate mask and a top surface of the second gate mask.

In an embodiment, a method includes: dividing a first gate structure into second gate structures by etching an opening in the first gate structure; depositing an isolation layer in the opening, the isolation layer including an expandable dielectric material; expanding the isolation layer in the opening by treating the expandable dielectric material; and removing portions of the isolation layer over the second gate structures, a remaining portion of the isolation layer in the opening forming a gate isolation structure between the second gate structures. In some embodiments of the method, treating the expandable dielectric material includes annealing the isolation layer in an oxygen-containing environment. In some embodiments of the method, treating the expandable dielectric material includes bombarding the isolation layer with ions of an element that induces cross-linking of the expandable dielectric material. In some embodiments of the method, bombarding the isolation layer includes generating a plasma from oxygen gas or ammonia. In some embodiments, the method further includes: performing a first pre-treatment process to shrink the isolation layer. In some embodiments, the method further includes: performing a second pre-treatment process to clean surface impurities from the isolation layer. In some embodiments of the method, the expandable dielectric material is a nitrogen-rich dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    dividing a first gate structure into a plurality of second gate structures by etching an opening through the first gate structure, the opening physically separating the first gate structure into the second gate structures;
    depositing an isolation layer in the opening, the isolation layer comprising an expandable dielectric material;
    expanding the isolation layer in the opening by treating the expandable dielectric material; and
    removing portions of the isolation layer over the second gate structures, a remaining portion of the isolation layer in the opening forming a gate isolation structure between the second gate structures.

2. The method of claim 1, wherein treating the expandable dielectric material comprises annealing the isolation layer in an oxygen-containing environment.

3. The method of claim 1, wherein treating the expandable dielectric material comprises bombarding the isolation layer with ions of an element that induces cross-linking of the expandable dielectric material.

4. The method of claim 3, wherein bombarding the isolation layer comprises generating a plasma from oxygen gas or ammonia.

5. The method of claim 3, further comprising:
performing a first pre-treatment process to shrink the isolation layer.

6. The method of claim 5, further comprising:
performing a second pre-treatment process to clean surface impurities from the isolation layer.

7. The method of claim 1, wherein the expandable dielectric material is a nitrogen-rich dielectric material.

8. A method comprising:
etching an opening between a first gate structure and a second gate structure;
forming a gate isolation structure between the first gate structure and the second gate structure by:
depositing an isolation layer in the opening between the first gate structure and the second gate structure, wherein depositing the isolation layer forms a seam in the gate isolation structure, the seam comprising a portion of the opening unfilled by the isolation layer; and
shrinking the seam in the isolation layer by expanding the isolation layer, wherein expanding the isolation layer comprises increasing a concentration of an element in a material of the isolation layer;
forming an inter-layer dielectric over the gate isolation structure, the first gate structure, and the second gate structure; and
forming a first contact and a second contact through the inter-layer dielectric, the gate isolation structure disposed between the first contact and the second contact.

9. The method of claim 8, further comprising:
forming a first source/drain region and a second source/drain region, the first source/drain region disposed adjacent the first gate structure, the second source/drain region disposed adjacent the second gate structure, the first contact connected to the first source/drain region, the second contact connected to the second source/drain region.

10. The method of claim 9, further comprising:
etching the opening between a first gate spacer and a second gate spacer, the gate isolation structure formed between the first gate spacer and the second gate spacer, the first gate spacer disposed between the first source/drain region and the first gate structure, the second gate spacer disposed between the second source/drain region and the second gate structure.

11. The method of claim 8, wherein increasing the concentration of the element comprises:
bombarding the isolation layer with ions in a plasma treatment process to induce cross-linking of the material of the isolation layer at sidewalls of the seam, wherein the cross-linking chemically bonds opposing portions of the isolation layer to one another at an interface.

12. The method of claim 11, wherein the element is oxygen, and wherein bombarding the isolation layer comprises generating a plasma from an oxygen source precursor to form Si—O—Si bonds across the interface.

13. The method of claim 11, wherein the element is nitrogen, and wherein bombarding the isolation layer comprises generating a plasma from a nitrogen source precursor to form Si—N—Si bonds across the interface.

14. The method of claim 11, further comprising:
performing a first pre-treatment process before bombarding the isolation layer with ions, wherein the first pre-treatment process comprises shrinking the material of the isolation layer; and
performing a second pre-treatment process after the first pre-treatment process and before bombarding the isolation layer with ions, wherein the second pre-treatment process comprises cleaning surface impurities from the isolation layer.

15. A method comprising:
dividing a first gate structure into a plurality of second gate structures by etching an opening through the first gate structure, the opening physically separating the first gate structure into the second gate structures;
forming a gate isolation structure between the second gate structures by:
depositing an isolation layer in the opening, the isolation layer comprising an expandable dielectric material; and
expanding the isolation layer in the opening by bombarding the isolation layer with ions of an element that induces cross-linking of the expandable dielectric material; and
forming an inter-layer dielectric over the gate isolation structure and the second gate structures.

16. The method of claim 15, wherein an upper portion of the isolation layer has a first concentration of the element, a lower portion of the isolation layer has a second concentration of the element, and the second concentration is less than the first concentration.

17. The method of claim 15, wherein the element is oxygen.

18. The method of claim 15, wherein the element is nitrogen.

19. The method of claim 15, wherein depositing the isolation layer forms a seam in the gate isolation structure, and cross-linking of the expandable dielectric material chemically bonds portions of the isolation layer at sidewalls of the seam to one another.

20. The method of claim 15, further comprising, before expanding the isolation layer:
shrinking the isolation layer by performing a first pre-treatment process; and
cleaning the isolation layer by performing a second pre-treatment process after the first pre-treatment process.

* * * * *